US008642380B2

(12) United States Patent
Noda

(10) Patent No.: US 8,642,380 B2
(45) Date of Patent: Feb. 4, 2014

(54) MANUFACTURING METHOD OF SEMICONDUCTOR DEVICE

(75) Inventor: Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 272 days.

(21) Appl. No.: 13/165,963

(22) Filed: Jun. 22, 2011

(65) Prior Publication Data

US 2012/0003795 A1    Jan. 5, 2012

(30) Foreign Application Priority Data

Jul. 2, 2010    (JP) .................................. 2010-151641

(51) Int. Cl.
H01L 21/336    (2006.01)

(52) U.S. Cl.
USPC ..... 438/104; 438/158; 438/513; 257/E29.094

(58) Field of Classification Search
USPC .......................................... 438/104, 158, 513
See application file for complete search history.

(56) References Cited

U.S. PATENT DOCUMENTS

| | | | |
|---|---|---|---|
| 5,585,949 A | 12/1996 | Yamazaki et al. |
| 5,731,856 A | 3/1998 | Kim et al. |
| 5,744,864 A | 4/1998 | Cillessen et al. |
| 5,837,614 A | 11/1998 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Nomura et al., "Room-Temperature Fabrication of Transparent Flexible Thin-Film Transistors Using Amorphous Oxide Semiconductors," Nature, Nov. 25, 2004, vol. 432, pp. 488-492.

(Continued)

*Primary Examiner* — Alexander Ghyka
(74) *Attorney, Agent, or Firm* — Eric J. Robinson; Robinson Intellectual Property Law Office, P.C.

(57) ABSTRACT

An object is to provide a manufacturing method of a semiconductor device having a high field effect mobility and including an oxide semiconductor layer in a semiconductor device including an oxide semiconductor. Another object is to provide a manufacturing method of a semiconductor device capable of high speed operation. An oxide semiconductor layer is terminated by a halogen element, and thus an increase in the contact resistance between the oxide semiconductor layer and a conductive layer in contact with the oxide semiconductor layer is suppressed. Therefore, the contact resistance between the oxide semiconductor layer and the conductive layer becomes favorable and a transistor having a high field effect mobility can be manufactured.

8 Claims, 13 Drawing Sheets

(56) References Cited

U.S. PATENT DOCUMENTS

| | | |
|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,923,723 B2 | 4/2011 | Hayashi et al. |
| 8,084,307 B2 | 12/2011 | Itagaki et al. |
| 8,193,031 B2 | 6/2012 | Hosoba et al. |
| 8,193,068 B2 * | 6/2012 | Yamazaki et al. ............ 438/406 |
| 8,236,627 B2 | 8/2012 | Tsubuku et al. |
| 8,293,594 B2 | 10/2012 | Yamazaki et al. |
| 8,293,595 B2 | 10/2012 | Yamazaki et al. |
| 8,343,800 B2 | 1/2013 | Umeda et al. |
| 8,343,817 B2 | 1/2013 | Miyairi et al. |
| 8,344,374 B2 | 1/2013 | Yamazaki et al. |
| 8,461,583 B2 | 6/2013 | Yano et al. |
| 2001/0046027 A1 | 11/2001 | Tai et al. |
| 2002/0055241 A1 * | 5/2002 | Oh et al. ........................ 438/527 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0142690 A1 * | 6/2005 | Lee ................................ 438/72 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0191671 A1 * | 7/2009 | Takafuji et al. ............... 438/151 |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0283049 A1 | 11/2010 | Sato et al. |
| 2010/0320471 A1 * | 12/2010 | Takechi et al. .................. 257/59 |
| 2011/0050733 A1 | 3/2011 | Yano et al. |
| 2011/0089416 A1 * | 4/2011 | Yamazaki et al. ............... 257/43 |
| 2011/0215325 A1 | 9/2011 | Yamazaki et al. |
| 2011/0215331 A1 | 9/2011 | Yamazaki et al. |
| 2011/0233541 A1 * | 9/2011 | Yamazaki ........................ 257/43 |
| 2011/0287580 A1 | 11/2011 | Yamazaki et al. |
| 2012/0003795 A1 * | 1/2012 | Noda ............................ 438/158 |
| 2012/0122277 A1 | 5/2012 | Yamazaki et al. |
| 2012/0231581 A1 | 9/2012 | Yamazaki et al. |
| 2012/0235140 A1 | 9/2012 | Suzawa et al. |
| 2012/0309145 A1 * | 12/2012 | Song et al. .................... 438/217 |
| 2013/0161713 A1 * | 6/2013 | Yamazaki et al. ............. 257/296 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-034926 A | 2/1990 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-125141 A | 5/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-165528 A | 6/2006 |
| JP | 2006-165529 A | 6/2006 |
| JP | 2007-073558 A | 3/2007 |
| JP | 2007-096055 A | 4/2007 |
| JP | 2007-123861 A | 5/2007 |
| JP | 2007-220816 A | 8/2007 |
| JP | 2007-299913 A | 11/2007 |
| JP | 2009-141002 A | 6/2009 |
| JP | 2010-021170 A | 1/2010 |
| JP | 2010-056539 A | 3/2010 |

(56) References Cited

FOREIGN PATENT DOCUMENTS

| WO | WO-2004/114391 | 12/2004 |
|---|---|---|
| WO | WO-2009/031423 | 3/2009 |
| WO | WO 2009/072532 | 6/2009 |

OTHER PUBLICATIONS

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Nakamura et al., "Syntheses and crystal structures of new homologous compounds, indium iron zinc oxides $(InFeO_3(ZnO)_m)$ (m: natural number) and related compounds," Kotai Butsuri (Solid State Physics), 1993, vol. 28, No. 5, pp. 317-327.

Nomura et al., "Thin-Film Transistor Fabricated in Single-Crystalline Transparent Oxide Semiconductor," Science, May 23, 2003, vol. 300, No. 5623, pp. 1269-1272.

Fung et al. "Bias Temperature Stress Study of RF Sputter Amorphous In—Ga—Zn—O TFTs," IDW '08: Proceedings of the $15^{th}$ International Display Workshops, Dec. 3, 2008, pp. 1621-1624.

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. Amoled Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Nl, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

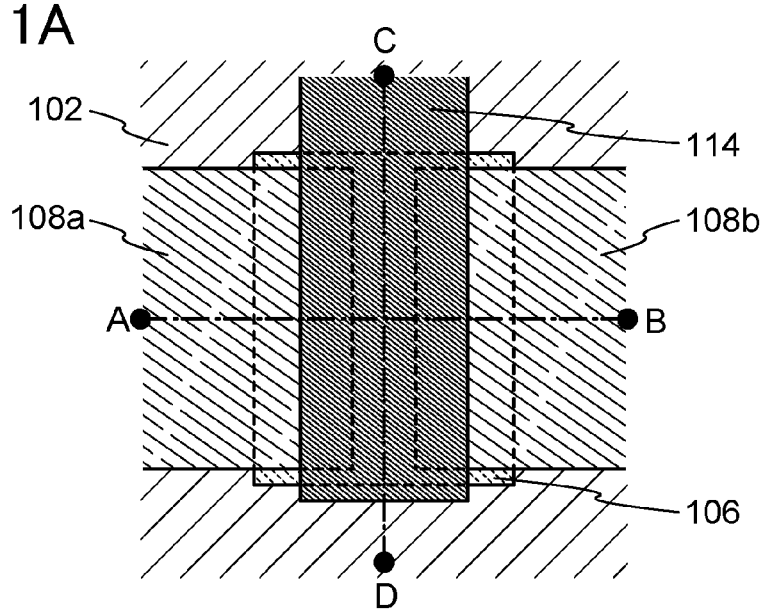
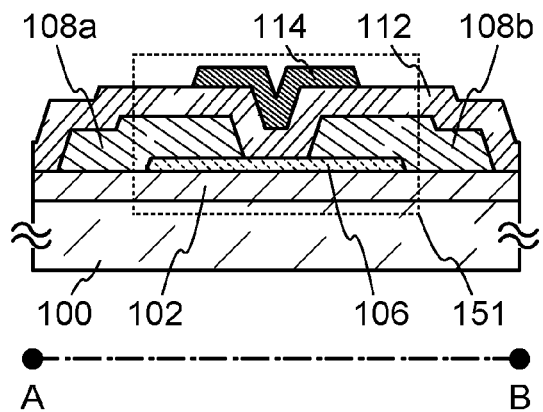
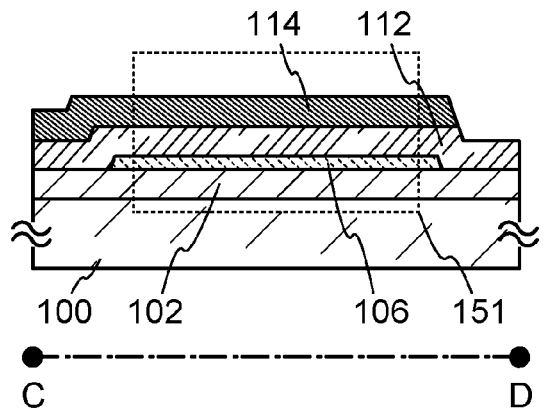

MANUFACTURING METHOD OF SEMICONDUCTOR DEVICE

BACKGROUND OF THE INVENTION

1. Field of the Invention

The present invention relates to a manufacturing method of a semiconductor device including an oxide semiconductor.

In this specification, a semiconductor device means all types of devices which can function by utilizing semiconductor characteristics, and an electro-optical device such as a liquid crystal display device, a semiconductor circuit, and an electronic device are all semiconductor devices.

2. Description of the Related Art

In recent years, a technique for forming a thin film transistor (TFT) by using a semiconductor thin film (having a thickness of approximately several nanometers to several hundreds of nanometers) formed over a substrate having an insulating surface has attracted attention. Thin film transistors are applied to a wide range of electronic devices such as integrated circuits (ICs) and electro-optical devices and, in particular, thin film transistors that are used as switching elements in image display devices are urgently developed. There exists a wide variety of metal oxides and such metal oxides are used for various applications. Indium oxide is a well-known material and is used as a transparent electrode material which is necessary for liquid crystal displays and the like.

Some metal oxides have semiconductor characteristics. Examples of the metal oxides having semiconductor characteristics are tungsten oxide, tin oxide, indium oxide, zinc oxide, and the like. Transistors in which a channel formation region is formed using such a metal oxide having semiconductor characteristics have already been known (Patent Document 1 and Patent Document 2).

REFERENCES

Patent Document

[Patent Document 1] Japanese Published Patent Application No. 2007-123861
[Patent Document 2] Japanese Published Patent Application No. 2007-96055

SUMMARY OF THE INVENTION

A transistor including an oxide semiconductor can operate at higher speed than a transistor including amorphous silicon because of having a higher field effect mobility (also referred to as a mobility or μFE) and can be manufactured more easily than a transistor including polycrystalline silicon. However, the transistor including an oxide semiconductor has a problem of having a lower mobility than the transistor including polycrystalline silicon.

For a transistor including an oxide semiconductor layer, high speed operation and a relatively simple manufacturing process are required.

In particular, it is preferable that the operation speed of a transistor used in a driver circuit be high; accordingly, the field effect mobility is preferably as high as possible.

For example, in the case of forming plural different kinds of circuits such as a pixel portion and a driver circuit portion over one substrate, a transistor used in the pixel portion needs to have excellent switching characteristics with a high on/off ratio, while a transistor used in the driver circuit portion needs to have a high mobility for high speed operation. In particular, as the definition of a display device is higher, writing time of a display image is reduced. Therefore, it is preferable that the transistor used in the driver circuit portion operate at high speed.

It is an object of the present invention to provide a manufacturing method of a semiconductor device including an oxide semiconductor layer and having a high field effect mobility.

Further, another object is to provide a manufacturing method of a semiconductor device capable of high speed operation.

In order to achieve the above objects, the present inventor focuses on a fact that in a semiconductor device including an oxide semiconductor layer as a semiconductor layer, the contact resistance between the oxide semiconductor layer and a conductive layer in contact with the oxide semiconductor layer influences the field effect mobility. In particular, in the case of forming a minute TFT, the contact area between the oxide semiconductor layer and the conductive layer in contact with the oxide semiconductor layer is small; as a result, the influence of the contact resistance becomes significantly large.

The oxide semiconductor is firmly bonded to an impurity (e.g., hydrogen or a hydroxyl group), and the impurity remains in the oxide semiconductor layer or on a surface of the oxide semiconductor layer. In the case where such an oxide semiconductor layer with a remaining impurity is used as a semiconductor layer, the contact resistance between the oxide semiconductor layer and a conductive layer in contact with the oxide semiconductor layer is increased and then an on-state current, which is one of TFT electric characteristics, is reduced, resulting in a reduction in field effect mobility.

In particular, when an oxide semiconductor layer with remaining hydrogen or a remaining hydroxyl group is used as a semiconductor layer, the hydrogen or the hydroxyl group diffuses into a conductive layer in contact with the oxide semiconductor layer, which forms an additional layer at an interface between the oxide semiconductor layer and the conductive layer.

Therefore, in order to achieve the above objects, impurities containing a hydrogen element are preferably removed thoroughly from the oxide semiconductor layer, so that an oxide semiconductor layer with high purity is formed and bonding of the impurities on a surface of the oxide semiconductor layer is prevented.

However, when a bond between a metal atom and oxygen is cut in an oxide semiconductor layer in a manufacturing process, a dangling bond of the metal atom may be generated in the oxide semiconductor layer in some cases. A dangling bond of the metal atom increases the carrier density and thus the metal atom becomes easy to be bonded to hydrogen or a hydroxyl group particularly on the surface of the oxide semiconductor layer. This increases the contact resistance between the oxide semiconductor layer and a conductive layer in contact with the oxide semiconductor layer. The increase in the contact resistance between the oxide semiconductor layer and the conductive layer reduces the on-state current, which is one of TFT electric characteristics, and reduces the field effect mobility.

Therefore, in order to achieve the above objects, a dangling bond of a metal atom generated in the oxide semiconductor layer is terminated by stable bonding except for bonding to hydrogen or a hydroxyl group. Specifically, after formation of the oxide semiconductor layer, plasma is generated using a gas including a halogen element and the dangling bond of the metal atom generated in the oxide semiconductor layer is terminated by the halogen element.

Even if the dangling bond of the metal atom on the surface of the oxide semiconductor layer is terminated by hydrogen or a hydroxyl group, generation of plasma using a gas including a halogen element allows the halogen element to be substituted for the hydrogen or the hydroxyl group, so that the oxide semiconductor layer terminated by the hydrogen or the hydroxyl group becomes the oxide semiconductor layer terminated by the halogen element.

In other words, the present invention is a manufacturing method of a semiconductor device based on a technical idea that an oxide semiconductor layer is terminated by a halogen element and is stabilized for suppressing an increase in the contact resistance between the oxide semiconductor layer and a conductive layer in contact with the oxide semiconductor layer. Details will be described below.

An embodiment of the present invention is a manufacturing method of a semiconductor device, which includes the steps of forming an oxide semiconductor layer over a substrate, performing plasma treatment on the oxide semiconductor layer using a gas including a halogen element, forming a source electrode and a drain electrode apart from each other over and in contact with the oxide semiconductor layer, forming a gate insulating layer having a portion in contact with the oxide semiconductor layer over the source electrode and the drain electrode, and forming a gate electrode over the oxide semiconductor layer with the gate insulating layer interposed therebetween. Accordingly, a dangling bond on a surface of the oxide semiconductor layer is terminated by the halogen element.

Another embodiment of the present invention is a manufacturing method of a semiconductor device, which includes the steps of forming a gate electrode over a substrate, forming a gate insulating layer over the gate electrode, forming an oxide semiconductor layer over the gate insulating layer, performing plasma treatment on the oxide semiconductor layer using a gas including a halogen element, and forming a source electrode and a drain electrode apart from each other over and in contact with the oxide semiconductor layer. Accordingly, a dangling bond on a surface of the oxide semiconductor layer is terminated by the halogen element.

In the above structures, a portion of the oxide semiconductor layer which overlaps with neither the source electrode nor the drain electrode may be etched in formation of the source electrode and the drain electrode.

Further, an embodiment of the present invention is a manufacturing method of a semiconductor device, which includes the steps of forming an oxide semiconductor layer over a substrate, forming a gate insulating layer and a gate electrode over the oxide semiconductor layer, forming a source region and a drain region by reducing the resistance of portions of the oxide semiconductor layer, forming a protective insulating layer over the oxide semiconductor layer and the gate electrode, forming openings in regions of the protective insulating layer overlapping with the source region and the drain region, and performing plasma treatment using a gas including a halogen element on the source region and the drain region of the oxide semiconductor layer. Accordingly, a dangling bond on a surface of the oxide semiconductor layer is terminated by the halogen element.

In the above structure, the oxide semiconductor layer may have a carrier concentration of lower than $1 \times 10^{-14}$ cm$^{-3}$.

In the above structure, the gas including a halogen element used in the plasma treatment may include any one element of F, Cl, Br, and I.

In the above structure, the gas including a halogen element used in the plasma treatment may be NF$_3$.

In the above structure, the source electrode and the drain electrode in contact with the oxide semiconductor layer may be formed using a metal including an element selected from Al, Cr, Cu, Ta, Ti, Mo, and W.

As a material used for the oxide semiconductor layer in this specification, an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material which are two-component metal oxides; an In—O-based material; a Sn—O-based material; a Zn—O-based material; or the like can be used. In addition, SiO$_2$ may be contained in the above-described materials. Here, for example, an In—Ga—Zn—O-based material means an oxide layer including indium (In), gallium (Ga), and zinc (Zn), and there is no particular limitation on the stoichiometric composition thereof. Further, the In—Ga—Zn—O-based material may contain an element other than In, Ga, and Zn.

For example, the oxide semiconductor layer can be formed with a thin film formed using a material represented by the chemical formula, InMO$_3$(ZnO)$_m$ (m>0). Here, M represents one or more metal elements selected from Ga, Al, Mn, and Co. For example, M can be Ga, Ga and Al, Ga and Mn, Ga and Co, or the like.

Note that the ordinal numbers such as "first" and "second" in this specification are used for convenience and do not denote the order of steps or the stacking order of layers. In addition, the ordinal numbers in this specification do not denote particular names which specify the present invention.

Using the present invention, an oxide semiconductor layer can be terminated by a halogen element and thus an increase in the contact resistance between the oxide semiconductor layer and a conductive layer in contact with the oxide semiconductor layer can be suppressed. Therefore, the contact resistance between the oxide semiconductor layer and the conductive layer becomes favorable and a transistor having a high field effect mobility can be manufactured.

Accordingly, a manufacturing method of a semiconductor device having a high field effect mobility and capable of high speed operation can be provided.

BRIEF DESCRIPTION OF THE DRAWINGS

In the accompanying drawings:

FIGS. 1A to 1C are a plan view and cross-sectional views, illustrating an example of a semiconductor device which is an embodiment of the present invention;

DETAILED DESCRIPTION OF THE INVENTION

Figure 2A:
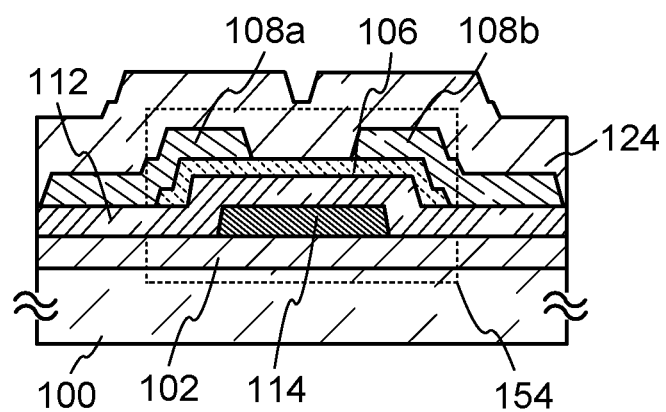
FIGS. 2A and 2B are cross-sectional views each illustrating an example of a semiconductor device which is an embodiment of the present invention.

Hereinafter, embodiments of the present invention will be described in detail with reference to the drawings. Note that the present invention is not limited to the following description and it will be easily understood by those skilled in the art that modes and details can be modified in various ways. Therefore, the present invention should not be construed as being limited to the description of the embodiments below. Note that in description of structures of the invention with reference to the drawings, the same reference numerals are commonly used to denote the same components among different drawings. The same hatching pattern is applied to similar parts, and the similar parts are not especially denoted by reference numerals in some cases.

(Embodiment 1)

In this embodiment, a manufacturing method of a transistor using a method in which an oxide semiconductor is deposited, plasma treatment is performed using a gas including a halogen element, and a surface of the oxide semiconductor is terminated by the halogen element will be described with reference to FIGS. 1A to 1C, FIGS. 2A and 2B, FIGS. 3A to 3E, FIGS. 4A to 4E, and FIGS. 5A to 5E.

FIGS. 1A to 1C are a top view and cross-sectional views illustrating a transistor 151 which is a top-gate top-contact transistor as an example of a semiconductor device according to one embodiment of the present invention. Here, FIG. 1A is a top view, FIG. 1B is a cross-sectional view along a broken line A-B of FIG. 1A, and FIG. 1C is a cross-sectional view along a broken line C-D of FIG. 1A. Note that in FIG. 1A, some of components of the transistor 151 (e.g., a gate insulating layer 112) are omitted for brevity.

The transistor 151 in FIGS. 1A to 1C includes a base insulating layer 102, an oxide semiconductor layer 106, a source electrode 108a, a drain electrode 108b, a gate insulating layer 112, and a gate electrode 114 over a substrate 100.

As a material of the base insulating layer 102, silicon oxide, silicon oxynitride, or the like may be used. Alternatively, the base insulating layer 102 may be formed using stacked layers of the above material and a material such as silicon oxide, silicon nitride, silicon oxynitride, silicon nitride oxide, gallium oxide, aluminum oxide, aluminum nitride, a mixed material of any of them, or the like. For example, when the base insulating layer 102 has a stacked structure of a silicon nitride layer and a silicon oxide layer, entry of moisture from the substrate 100 or the like to the transistor 151 can be prevented. In the case where the base insulating layer 102 is formed to have a stacked structure, an oxide layer of silicon oxide, silicon oxynitride, or the like is preferably formed as a layer in contact with the oxide semiconductor layer 106. Note that the base insulating layer 102 functions as a base layer of the transistor 151.

The oxide semiconductor layer 106 is preferably formed using a material having a bandgap greater than or equal to 3 eV, preferably a material having a bandgap greater than or equal to 3 eV and less than 3.6 eV. In addition, the electron affinity of the material is preferably higher than or equal to 4 eV, further preferably higher than or equal to 4 eV and lower than 4.9 eV. Among such materials, a material whose carrier concentration derived from a donor or an acceptor is lower than $1\times10^{-14}$ cm$^{-3}$, preferably lower than $1\times10^{-11}$ cm$^{-3}$ is desirable. In addition, the hydrogen concentration of the oxide semiconductor layer is preferably lower than $1\times10^{18}$ cm$^{-3}$, further preferably lower than $1\times10^{16}$ cm$^{-3}$. The oxide semiconductor layer is the one that is purified and made to be electrically i-type (intrinsic). A transistor whose active layer includes the above-described oxide semiconductor layer can have an off-state current as extremely low as 1 zA (zeptoampere, $10^{-21}$ A) (a value as extremely high as $10^{20}\Omega$ to $10^{21}\Omega$ when being converted into resistance).

In the oxide semiconductor layer 106 of the transistor 151, a dangling bond generated in an oxide semiconductor or on a surface of the oxide semiconductor in the formation step of the oxide semiconductor layer is terminated by a halogen element by plasma treatment using a gas including a halogen element after the formation of the oxide semiconductor layer 106. Accordingly, an increase in the contact resistance between the oxide semiconductor layer 106 and the source and drain electrodes 108a and 108b can be suppressed.

The gate insulating layer 112 can have a structure similar to that of the base insulating layer 102. A material having a high dielectric constant, such as hafnium oxide or aluminum oxide, may be used for the gate insulating layer 112 considering the function of the gate insulating layer of the transistor. Alternatively, considering the gate withstand voltage and the state of an interface of the oxide semiconductor, a material having a high dielectric constant, such as hafnium oxide or aluminum oxide, may be stacked on gallium oxide, silicon oxide, silicon oxynitride, or silicon nitride.

A protective insulating layer may further be provided over the transistor 151. The protective insulating layer can have a structure similar to that of the base insulating layer 102. In order to electrically connect the source electrode 108a or the drain electrode 108b and a wiring, an opening may be formed in the base insulating layer 102, the gate insulating layer 112, and the like. A second gate electrode may further be provided below the oxide semiconductor layer 106. Note that it is not always necessary but preferable to process the oxide semiconductor layer 106 into an island shape.

Figure 2B:
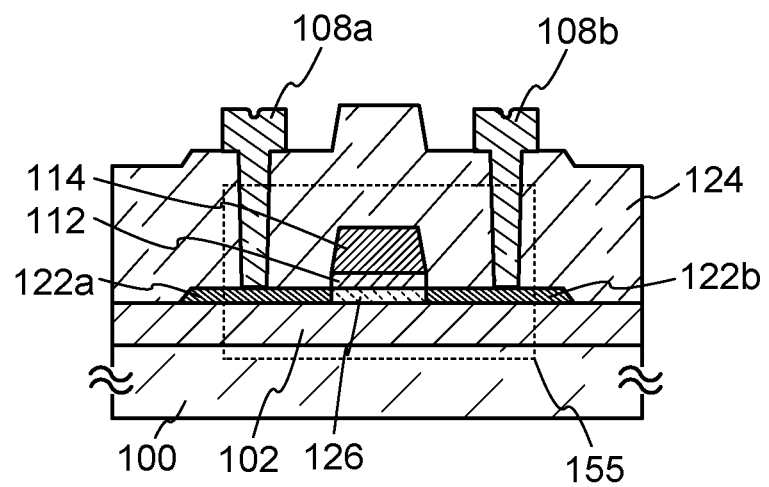

Next, FIGS. 2A and 2B illustrate cross-sectional structures of transistors having different structures from that of the transistor 151.

A transistor 154 in FIG. 2A is the same as the transistor 151 in that it includes the base insulating layer 102, the oxide semiconductor layer 106, the source electrode 108a, the drain electrode 108b, the gate insulating layer 112, and the gate electrode 114. The difference between the transistor 154 and the transistor 151 is the position of the gate electrode with respect to the oxide semiconductor layer 106. That is, in the transistor 154, the gate electrode is provided below the oxide semiconductor layer 106 with the gate insulating layer 112 interposed therebetween. In addition, in the transistor 154, a protective insulating layer 124 is provided so as to cover the source electrode 108a, the drain electrode 108b, and the oxide semiconductor layer 106. The other components are similar to those of the transistor 151 in FIGS. 1A to 1C.

In the oxide semiconductor layer 106 of the transistor 154 in FIG. 2A as well, a dangling bond generated in an oxide semiconductor or on a surface of the oxide semiconductor in the formation step of the oxide semiconductor layer is terminated by a halogen element by plasma treatment using a gas including a halogen element, in a manner similar to that of the oxide semiconductor layer 106 of the transistor 151.

A transistor 155 in FIG. 2B is the same as the transistor 151 and the transistor 154 in that it includes the base insulating layer 102, the gate insulating layer 112, the gate electrode 114, the source electrode 108a, and the drain electrode 108b. The transistor 155 is different from the transistor 151 and the transistor 154 in that a channel region 126, a source region 122a, and a drain region 122b are formed in the oxide semiconductor layer in the same plane. The source region 122a and the drain region 122b are connected to the source electrode 108a and the drain electrode 108b, respectively; the source electrode 108a and the drain electrode 108b are formed in openings provided in the protective insulating layer 124.

After formation of the oxide semiconductor layer, the gate insulating layer 112 and the gate electrode 114 are formed. The gate electrode 114 and the gate insulating layer 112 can be formed by processing with the use of the same mask. Alternatively, after forming the gate electrode 114 by processing, the gate insulating layer 112 may be formed by processing with the use of the gate electrode 114 as a mask. Next, the resistance of the oxide semiconductor layer is reduced using the gate electrode 114 as a mask, so that the source region 122a and the drain region 122b are formed. A region of the oxide semiconductor layer existing under the gate electrode 114 is the channel region 126.

Next, after the protective insulating layer 124 is formed, openings for connection to the source electrode 108a and the drain electrode 108b are formed. Then, plasma treatment using a gas including a halogen element is performed on the source region 122a and the drain region 122b, which are portions of the oxide semiconductor layer, and the protective insulating layer 124.

In the source region 122a and the drain region 122b in the oxide semiconductor layer of the transistor 155 in FIG. 2B as well, a dangling bond generated in an oxide semiconductor or on a surface of the oxide semiconductor in the formation step of the oxide semiconductor layer is terminated by a halogen element by plasma treatment using a gas including a halogen element, in a manner similar to that of the oxide semiconductor layer 106 of the transistor 151.

With reference to FIGS. 3A to 3E, FIGS. 4A to 4E, and FIGS. 5A to 5E, examples of manufacturing processes of the transistor 151 illustrated in FIGS. 1A to 1C, the transistor 154 illustrated in FIG. 2A, and the transistor 155 illustrated in FIG. 2B will be described below.

To begin with, an example of a manufacturing process of the transistor 151 illustrated in FIGS. 1A to 1C will be described with reference to FIGS. 3A to 3E.

Figure 3A:
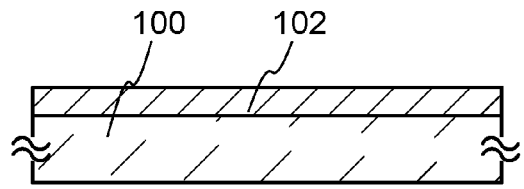
FIGS. 3A to 3E are cross-sectional views illustrating an example of a manufacturing process of a semiconductor device which is an embodiment of the present invention.

First, the base insulating layer 102 is formed over the substrate 100 (see FIG. 3A).

There is no particular limitation on the property of a material and the like of the substrate 100 as long as the material has heat resistance enough to withstand at least heat treatment to be performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may alternatively be used as the substrate 100. In the case where a transistor is provided over a flexible substrate, either of the following methods can be employed: a method in which a transistor is directly formed over a flexible substrate; and a method in which a transistor is formed over a different substrate and then separated from the substrate and transferred onto a flexible substrate. In order to separate the transistor to transfer it to the flexible substrate, a separation layer is preferably formed between the different substrate and the transistor.

As a formation method of the base insulating layer 102, a plasma CVD method or a sputtering method can be employed, for example. As a material of the base insulating layer 102, silicon oxide, silicon oxynitride, or the like may be used. Alternatively, the base insulating layer 102 may be formed using stacked layers of the above material and a material such as silicon oxide, silicon nitride, silicon oxynitride, silicon nitride oxide, aluminum oxide, aluminum nitride, a mixed material of any of them, or the like. In the case where the base insulating layer 102 is formed to have a stacked structure, an oxide layer of silicon oxide, silicon oxynitride, or the like is preferably formed as a layer in contact with the oxide semiconductor layer 106. The total thickness of the base insulating layer 102 is preferably 20 nm or more, further preferably 100 nm or more.

Figure 3B:
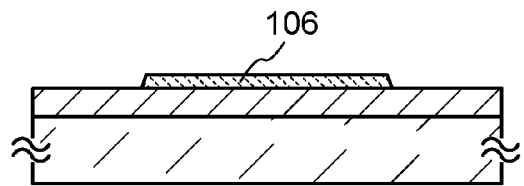

Next, an oxide semiconductor layer is formed over the base insulating layer 102 and then is processed to form the oxide semiconductor layer 106 having an island shape (see FIG. 3B).

For example, the oxide semiconductor layer 106 can be formed by a sputtering method, a vacuum evaporation method, a pulse laser deposition method, a plasma CVD method, or the like. The thickness of the oxide semiconductor layer 106 is preferably more than or equal to 3 nm and less than or equal to 50 nm. This is because, when the oxide semiconductor layer 106 is too thick (e.g., 100 nm or more), there is a possibility that a short channel effect might have a large impact and the transistor with small size might be normally on.

Note that in this specification, an n-channel transistor having a positive gate voltage when drain current is $1 \times 10^{-12}$ A according to the measurement of drain current-gate voltage characteristics is defined as a normally-off transistor. In addition, an n-channel transistor having a negative gate voltage when drain current is $1 \times 10^{-12}$ A according to the measurement of drain current-gate voltage characteristics is defined as a normally-on transistor.

In this embodiment, the oxide semiconductor layer is formed by a sputtering method with the use of an In—Ga—Zn—O-based metal oxide target.

As the In—Ga—Zn—O-based metal oxide target, for example, a metal oxide target containing $In_2O_3$, $Ga_2O_3$, and ZnO in a composition ratio of 1:1:1 [molar ratio] can be used. Note that it is not necessary to limit the material and the composition ratio of the target to the above; for example, a metal oxide target containing $In_2O_3$, $Ga_2O_3$, and ZnO in a composition ratio of 1:1:2 [molar ratio] can also be used.

The relative density of the metal oxide target is higher than or equal to 90% and lower than or equal to 100%, preferably higher than or equal to 95% and lower than or equal to 99.9%.

This is because, with the use of a metal oxide target with a high relative density, a dense oxide semiconductor layer can be formed.

The film formation may be performed under a rare gas (typically argon) atmosphere, an oxygen atmosphere, a mixed atmosphere containing a rare gas and oxygen, or the like. Moreover, it is preferable to use an atmosphere using a high-purity gas from which impurities such as hydrogen, water, a hydroxyl group, and a hydride are sufficiently removed in order to prevent entry of hydrogen, water, a hydroxyl group, and a hydride into the oxide semiconductor layer.

The oxide semiconductor layer may be subjected to plasma treatment using a gas including oxygen. By performing plasma treatment using a gas including oxygen on the oxide semiconductor layer, the oxygen can be contained in the oxide semiconductor layer and/or in the vicinity of a surface of the oxide semiconductor layer. In that case, the amount of oxygen contained in the oxide semiconductor layer is greater than the stoichiometric proportion of the oxide semiconductor layer, preferably greater than the stoichiometric proportion and less than the double of the stoichiometric proportion. It can be alternatively said that the amount of oxygen contained is made to greater than Y, where the amount of oxygen contained in a single crystalline oxide semiconductor film is denoted by Y, preferably to greater than Y and less than 2Y. Still alternatively, the amount of oxygen may be greater than Z, preferably greater than Z and less than 2Z based on the amount of oxygen Z in the oxide semiconductor layer in the case where plasma treatment using a gas including oxygen is not performed. The reason why the above preferable range has the upper limit is because the oxide semiconductor layer might absorb hydrogen like a hydrogen absorbing alloy (a hydrogen storage alloy) when the amount of oxygen contained is too large. Note that in the oxide semiconductor film, the amount of oxygen contained is larger than the amount of hydrogen contained.

Next, plasma treatment using a gas including a halogen element is performed on the oxide semiconductor layer 106. By the plasma treatment using a gas including a halogen element, a dangling bond in the oxide semiconductor or on a surface of the oxide semiconductor layer is terminated by the halogen element.

Even if the surface of the oxide semiconductor layer is terminated by hydrogen or a hydroxyl group, generation of plasma using a gas including a halogen element allows the halogen element to be substituted for the hydrogen or the hydroxyl group, so that the oxide semiconductor layer terminated by the hydrogen or the hydroxyl group becomes the oxide semiconductor layer terminated by the halogen element.

For example, the formation of the oxide semiconductor layer and the plasma treatment using a gas including a halogen element are performed as follows.

An example of the film formation conditions is as follows: the distance between a substrate and a target is 60 mm; the pressure is 0.4 Pa; the direct-current (DC) power is 0.5 kW; and the film formation atmosphere is a mixed atmosphere containing argon and oxygen (the flow rate of oxygen is 33%). Note that a pulse DC sputtering method is preferable because powder substances (also referred to as particles or dust) generated in film formation can be reduced and the film thickness can be uniform.

First, the substrate 100 is placed in a deposition chamber kept under reduced pressure, and the substrate temperature is set to higher than or equal to 100° C. and lower than or equal to 600° C., preferably higher than or equal to 200° C. and lower than or equal to 450° C. The concentration of excessive hydrogen (including water and a hydroxyl group) and other impurities in the oxide semiconductor film can be reduced when film formation is performed under the state in which the substrate 100 is heated. Moreover, damage due to sputtering can be reduced. In addition, oxygen is released from the base insulating layer 102, whereby oxygen deficiency in the oxide semiconductor layer and the interface state density between the base insulating layer 102 and the oxide semiconductor layer can be reduced.

Note that before the oxide semiconductor layer is formed by a sputtering method, a substance attached to a surface where the oxide semiconductor layer is to be formed (e.g., a surface of the base insulating layer 102) may be removed by reverse sputtering in which an argon gas is introduced and plasma is generated. Here, the reverse sputtering is a method in which ions collide with a surface to be processed so that the surface is modified, in contrast to normal sputtering in which ions collide with a sputtering target. As an example of a method for making ions collide with a surface to be processed, there is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

The oxide semiconductor layer 106 can be obtained through the steps of forming a mask having a desired shape over the oxide semiconductor layer and etching the oxide semiconductor layer. The mask may be formed by a method such as photolithography. Alternatively, the mask may be formed by an ink jet method or the like.

For the etching to obtain the oxide semiconductor layer 106, either wet etching or dry etching may be employed. It is needless to say that both of them may be employed in combination.

After that, heat treatment (first heat treatment) is preferably performed on the oxide semiconductor layer 106. By the first heat treatment, excessive hydrogen (including water and a hydroxyl group) in the oxide semiconductor layer can be removed and a structure of the oxide semiconductor layer 106 can be ordered. The temperature of the first heat treatment is higher than or equal to 100° C. and lower than or equal to 650° C. or lower than the strain point of the substrate, preferably higher than or equal to 250° C. and lower than or equal to 600° C. The heat treatment is performed in an oxidation gas atmosphere or an inert gas atmosphere.

Note that the inert gas atmosphere is an atmosphere which contains nitrogen or a rare gas (e.g., helium, neon, or argon) as its main component and preferably does not contain water, hydrogen, or the like. For example, the purity of nitrogen or a rare gas such as helium, neon, or argon introduced into a heat treatment apparatus is set to 6N (99.9999%) or higher, preferably 7N (99.99999%) or higher (i.e., the impurity concentration is 1 ppm or lower, preferably 0.1 ppm or lower). The inert gas atmosphere is an atmosphere that contains an inert gas as its main component and contains a reactive gas at a concentration lower than 10 ppm.

Note that the oxidation gas refers to oxygen, ozone, nitrogen dioxide, or the like and preferably does not contain water, hydrogen, and the like. For example, the purity of oxygen, ozone, nitrogen dioxide, or the like introduced into the heat treatment apparatus is greater than or equal to 6N (99.9999%), preferably greater than or equal to 7N (99.99999%) (i.e., the impurity concentration is less than or equal to 1 ppm, preferably less than or equal to 0.1 ppm). An oxidation gas mixed with an inert gas may be used as the oxidation gas atmosphere and includes an oxidation gas at least at a concentration greater than or equal to 10 ppm.

The heat treatment can be performed in such a manner that, for example, an object to be processed is introduced into an electric furnace in which a resistance heating element or the like is used and heated at 350° C. under a nitrogen atmosphere for an hour. During the heat treatment, the oxide semiconductor layer 106 is not exposed to the air to prevent entry of water and hydrogen.

The heat treatment apparatus is not limited to an electric furnace and the heat treatment apparatus can be an apparatus that heats an object to be processed by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The object to be processed is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object to be processed. Note that the inert gas atmosphere may be changed during the process to an atmosphere including an oxidation gas. This is because by performing the first heat treatment in the atmosphere including an oxidation gas, the oxygen deficiency in the oxide semiconductor layer 106 can be reduced and defect levels in an energy gap due to the oxygen deficiency can be reduced.

The above heat treatment (the first heat treatment) can also be referred to as dehydration treatment, dehydrogenation treatment, or the like because of its advantageous effect of removing excessive hydrogen (including water and a hydroxyl group) and the like. In addition, the above heat treatment can also be referred to as treatment for supplying oxygen because of its advantageous effect of supplying oxygen from the insulating layer, a heat treatment atmosphere, or the like. The dehydration treatment, dehydrogenation treatment, or treatment for supplying oxygen may be performed at the timing, for example, after the oxide semiconductor layer is processed into an island shape. Such dehydration treatment, dehydrogenation treatment, or treatment for supplying oxygen may be performed once or plural times.

Next, as an example of conditions of the plasma treatment using a gas including a halogen element, the following conditions can be employed: the flow rate of $NF_3$ is 20 sccm, the flow rate of $N_2$ is 80 sccm, the treatment pressure is 0.67 Pa, the substrate temperature is 40° C., the treatment time is 10 seconds, and the high-frequency (RF) power supply is 2 kW. Note that although $N_2$ gas is added in this embodiment, the present invention is not limited to this, and only $NF_3$ or another gas may be added.

Note that the case is described here in which the first heat treatment is performed after the oxide semiconductor layer 106 having an island shape is formed by processing; however, one embodiment of the present invention is not limited thereto. The processing into the oxide semiconductor layer 106 may be performed after the first heat treatment.

Here, a procedure in which after the oxide semiconductor layer 106 having an island shape is formed, the first heat treatment is performed and then the plasma treatment using a gas including a halogen element is performed is described; however, the present invention is not limited to this procedure. Although it is preferable that after formation of the oxide semiconductor layer 106 having an island shape by processing, the first heat treatment be performed and then the plasma treatment using a gas including a halogen element be performed as in this embodiment, the plasma treatment using a gas including a halogen element may be performed before the oxide semiconductor layer is processed into an island shape or before the first heat treatment is performed. It is more effective to perform the plasma treatment using a gas including a halogen element right before formation of a conductive layer for forming a source electrode and a drain electrode (the conductive layer is to be formed in a subsequent step).

Figure 3C:
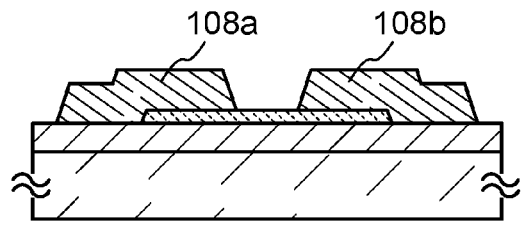

Next, a conductive layer for forming the source electrode and the drain electrode (including a wiring formed in the same layer as the source electrode and the drain electrode) is formed over the base insulating layer 102 and the oxide semiconductor layer 106 and processed to form the source electrode 108a and the drain electrode 108b (see FIG. 3C). A channel length L of the transistor is determined by the distance between edges of the source electrode 108a and the drain electrode 108b which are formed here.

As the conductive layer used for the source electrode 108a and the drain electrode 108b, for example, a metal layer containing an element selected from Al, Cr, Cu, Ta, Ti, Mo, and W, or a metal nitride layer containing any of the above elements as its component (e.g., a titanium nitride layer, a molybdenum nitride layer, or a tungsten nitride layer) can be used. A high melting point metal layer of Ti, Mo, W, or the like or a metal nitride layer of any of these elements (a titanium nitride layer, a molybdenum nitride layer, or a tungsten nitride layer) may be stacked on one of or both a bottom side and a top side of a metal layer of Al, Cu, or the like.

Alternatively, the conductive layer used for the source electrode 108a and the drain electrode 108b may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon or silicon oxide is contained can be used.

The conductive layer can be processed by etching with the use of a resist mask. Ultraviolet, a KrF laser light, an ArF laser light, or the like is preferably used for light exposure for forming a resist mask for the etching.

In the case where the channel length L is less than 25 nm, the light exposure at the time of forming the resist mask is preferably performed using, for example, extreme ultraviolet having an extremely short wavelength of several nanometers to several tens of nanometers. In the light exposure by extreme ultraviolet light, the resolution is high and the depth of focus is large. Thus, the channel length L of the transistor formed later can be shortened, whereby the operation speed of a circuit can be increased.

Etching may be performed with the use of a resist mask formed using a so-called multi-tone mask. A resist mask formed using a multi-tone mask has a plurality of thicknesses and can be further changed in shape by ashing; thus, the resist mask can be used in a plurality of etching steps for different patterns. Therefore, a resist mask corresponding to at least two kinds of different patterns can be formed by using one multi-tone mask. That is, the process can be simplified.

At the time of formation of the source electrode 108a and the drain electrode 108b, a portion of the oxide semiconductor layer 106 (a region between the source electrode 108a and the drain electrode 108b) is etched, so that the oxide semiconductor layer 106 becomes an oxide semiconductor layer having a groove portion (depression portion).

The region between the source electrode 108a and the drain electrode 108b in the oxide semiconductor layer 106 serves as a channel region of the transistor. The uppermost surface of only this region is etched, whereby a portion of the oxide semiconductor layer that has the surface terminated by the halogen element is removed. It is preferable that the channel region do not include hydrogen, a hydroxyl group, and a halogen element.

After that, plasma treatment may be performed using a gas such as oxygen, ozone, or nitrogen dioxide in order that the exposed surface of the oxide semiconductor layer 106 is oxidized and oxygen deficiency is reduced. In the case where the plasma treatment is performed, the gate insulating layer 112 in contact with part of the oxide semiconductor layer 106 is preferably formed following the plasma treatment without exposure to the air.

Figure 3D:
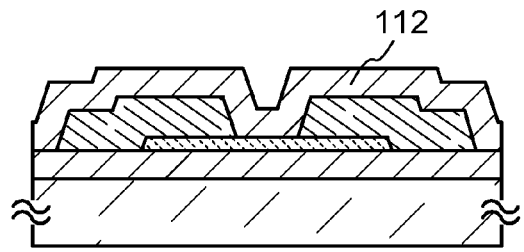

Then, the gate insulating layer 112 is formed to cover the source electrode 108a and the drain electrode 108b and be in contact with part of the oxide semiconductor layer 106 (see FIG. 3D).

The gate insulating layer 112 can have a structure similar to that of the base insulating layer 102. Note that a material having a high dielectric constant, such as hafnium oxide or aluminum oxide, may be used for the gate insulating layer 112 considering the function of the gate insulating layer of the transistor. Alternatively, considering the gate withstand voltage and the state of an interface of the oxide semiconductor, a material having a high dielectric constant, such as hafnium oxide or aluminum oxide, may be stacked on silicon oxide, silicon oxynitride, or silicon nitride. The thickness of the gate insulating layer 112 is preferably greater than or equal to 1 nm and less than or equal to 300 nm, further preferably greater than or equal to 5 nm and less than or equal to 100 nm. As the thickness of the gate insulating layer 112 is larger, a short channel effect is enhanced more and the threshold voltage tends to shift more in the negative side.

Second heat treatment is preferably performed after the gate insulating layer 112 is formed. The second heat treatment is performed at a temperature of higher than or equal to 250° C. and lower than or equal to 700° C., preferably higher than or equal to 350° C. and lower than or equal to 600° C. or lower than the strain point of the substrate.

The second heat treatment may be performed under an oxidation gas atmosphere or an inert gas atmosphere. It is preferable that water, hydrogen, and the like be not contained in the atmosphere. Further, the purity of the gas introduced into a heat treatment apparatus is preferably set to 6N (99.9999%) or higher, more preferably 7N (99.99999%) or higher (that is, the impurity concentration is 1 ppm or lower, preferably 0.1 ppm or lower).

The second heat treatment is performed while the oxide semiconductor layer 106 and the gate insulating layer 112 are in contact with each other. Thus, oxygen which is one of main components of the oxide semiconductor can be supplied from the gate insulating layer 112 to the oxide semiconductor layer 106. Accordingly, oxygen deficiency in the oxide semiconductor layer 106 and the interface state density between the oxide semiconductor layer 106 and the gate insulating layer 112 can be reduced. At the same time, deficiency in the gate insulating layer 112 can also be reduced.

Note that there is no particular limitation on the timing of the second heat treatment as long as it is after the formation of the gate insulating layer 112. For example, the second heat treatment may be performed after the formation of the gate electrode 114.

Figure 3E:
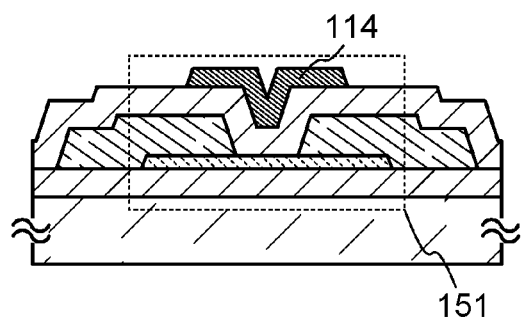

Then, the gate electrode 114 is formed (see FIG. 3E). The gate electrode 114 can be formed using a metal material such as molybdenum, titanium, tantalum, tungsten, aluminum, copper, neodymium, or scandium, a nitride of any of these metal materials, or an alloy material which contains any of these metal materials as its main component. Note that the gate electrode 114 may have a single-layer structure or a stacked structure.

Through the above-described process, the transistor 151 is manufactured.

Next, an example of a manufacturing process of the transistor 154 in FIG. 2A will be described with reference to FIGS. 4A to 4E.

Figure 4A:
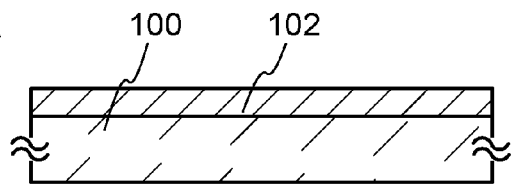
FIGS. 4A to 4E are cross-sectional views illustrating an example of a manufacturing process of a semiconductor device which is an embodiment of the present invention.

First, the base insulating layer 102 is formed over the substrate 100 (see FIG. 4A).

Figure 4B:
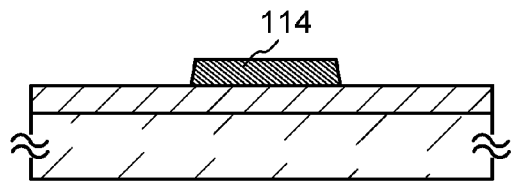

Next, the gate electrode 114 is formed over the base insulating layer 102 (see FIG. 4B).

Figure 4C:
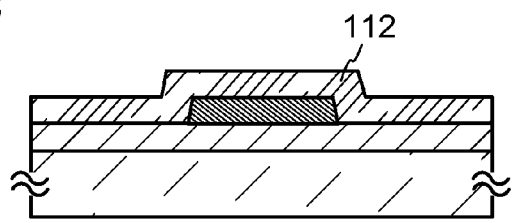
Figure 4D:
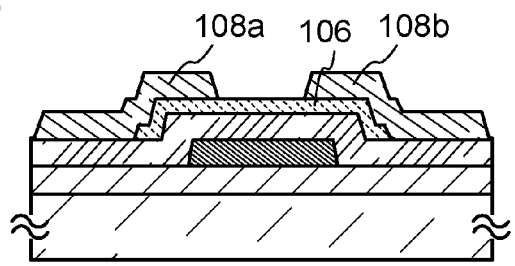

Then, the gate insulating layer 112 is formed over the gate electrode 114 (see FIG. 4C).

Next, an oxide semiconductor layer is formed over the gate insulating layer 112 and processed to form the oxide semiconductor layer 106 having an island shape. After that, first heat treatment similar to that for the transistor 151 is performed, and plasma treatment using a gas including a halogen element is performed on the oxide semiconductor layer. Then, the oxide semiconductor layer 106 is connected to the source electrode 108a and the drain electrode 108b (see FIG. 4D). The plasma treatment using a gas including a halogen element can be performed by a method similar to that for the transistor 151.

Since a surface of the oxide semiconductor layer 106 is terminated by a halogen element, an increase in the contact resistance between the oxide semiconductor layer 106 and the source and drain electrodes 108a and 108b can be suppressed.

At the time of formation of the source electrode 108a and the drain electrode 108b, a portion of the oxide semiconductor layer 106 (a region between the source electrode 108a and the drain electrode 108b) is etched, so that the oxide semiconductor layer 106 becomes an oxide semiconductor layer having a groove portion (depression portion).

The region between the source electrode 108a and the drain electrode 108b in the oxide semiconductor layer 106 serves as a channel region of the transistor. The uppermost surface of only this region is etched, whereby a portion of the oxide semiconductor layer that has the surface terminated by the halogen element is removed. It is preferable that the channel region do not include hydrogen, a hydroxyl group, and a halogen element.

Figure 4E:
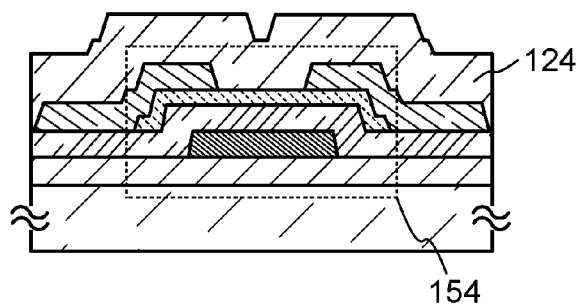

Next, the protective insulating layer 124 is formed to cover the oxide semiconductor layer 106, the source electrode 108a, and the drain electrode 108b (see FIG. 4E).

Through the above-described process, the transistor 154 is manufactured.

An example of a manufacturing process of the transistor 155 in FIG. 2B will be described with reference to FIGS. 5A to 5E.

Figure 5A:
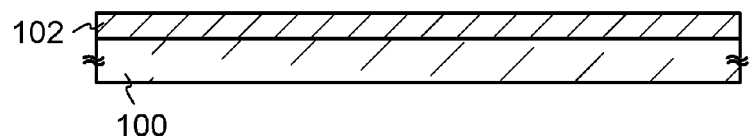
FIGS. 5A to 5E are cross-sectional views illustrating an example of a manufacturing process of a semiconductor device which is an embodiment of the present invention.

First, the base insulating layer 102 is formed over the substrate 100 (see FIG. 5A).

Figure 5B:
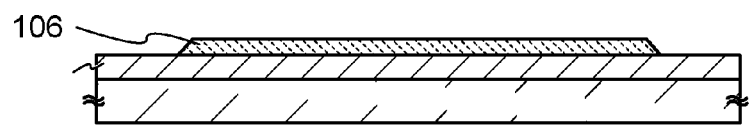

Next, an oxide semiconductor layer is formed over the base insulating layer 102 and then is processed to form the oxide semiconductor layer 106 having an island shape (see FIG. 5B). After that, first heat treatment similar to that for the transistor 151 is performed.

Figure 5C:
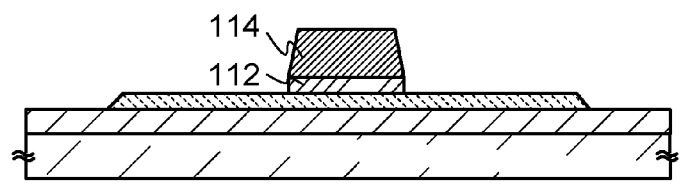
Figure 5D:
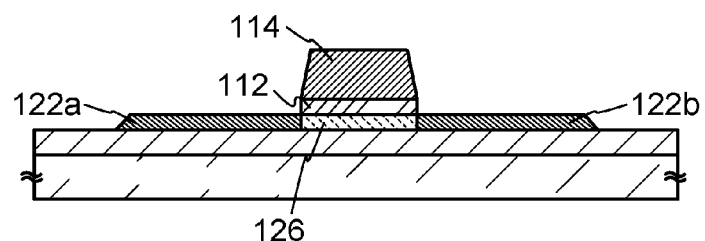

Next, the gate insulating layer 112 and the gate electrode 114 are formed by processing to have similar patterns by photolithography (see FIG. 5C). At this time, after forming the gate electrode 114 by processing, the gate insulating layer 112 may be formed by processing with the use of the gate electrode 114 as a mask.

Next, the resistance of the oxide semiconductor layer 106 is reduced using the gate electrode 114 as a mask, so that the source region 122a and the drain region 122b are formed. A region under the gate electrode where the resistance is not reduced serves as the channel region 126 (see FIG. 5D). At this time, the channel length L of the transistor is determined by the width of the gate electrode. By patterning using the gate electrode as a mask in such a manner, the source region and the drain region do not overlap with the gate electrode and parasitic capacitance is not generated; therefore, the operation speed of the transistor can be increased.

Next, the protective insulating layer 124 is formed and openings are provided in regions of the protective insulating layer 124, which overlap with the source region and the drain region. After providing the openings in the protective insulating layer 124, plasma treatment using a gas including a halogen element is performed on the source region 122a and the drain region 122b, which are portions of the oxide semiconductor layer 106, and the protective insulating layer 124. The plasma treatment can be performed by a method similar to that for the transistor 151.

Figure 5E:
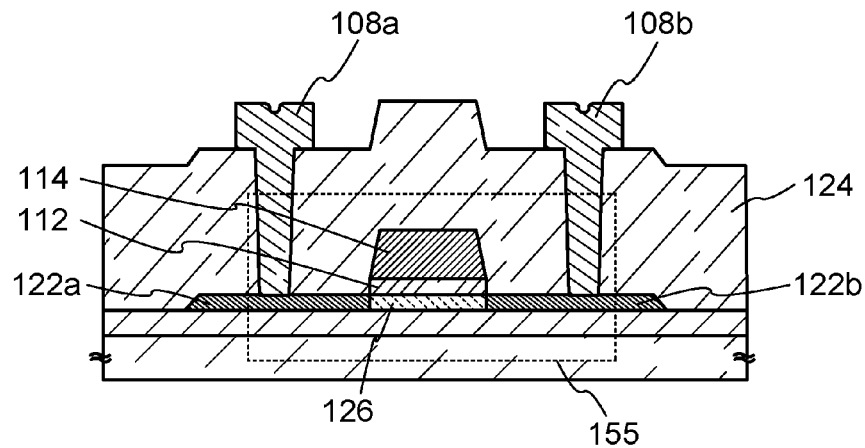

Next, a conductive layer for forming the source electrode and the drain electrode (including a wiring formed in the same layer as the source and drain electrodes) is formed and processed to form the source electrode 108a and the drain electrode 108b (see FIG. 5E).

Since surfaces of the source region 122a and the drain region 122b, which are portions of the oxide semiconductor layer 106, are terminated by a halogen element, an increase in the contact resistance between the source and drain regions 122a and 122b and the source and drain electrodes 108a and 108b can be suppressed.

Since the channel region 126 is covered with the protective insulating layer 124, the gate electrode 114, and the gate insulating layer 112, the channel region 126 is not exposed to plasma at the time of the plasma treatment using a gas including a halogen element.

Through the above process, the transistor 155 is manufactured.

The oxide semiconductor layer used as an active layer of the transistor in this embodiment is purified and made to be electrically i-type (intrinsic) by the following method: an impurity such as hydrogen (including water and a hydroxyl group) is removed from an oxide semiconductor by heating the substrate at the step for forming the oxide semiconductor layer or by performing heat treatment after the formation of the oxide semiconductor layer; and oxygen, which is a main component of the oxide semiconductor layer and is reduced at the same time as the step of removing the impurity, is supplied to the oxide semiconductor layer from the insulating layer. Since the surface of the oxide semiconductor layer which the source electrode and the drain electrode are in contact with is terminated by the plasma treatment using a gas including a halogen element, an increase in the contact resistance between the oxide semiconductor layer and the source and drain electrodes can be suppressed.

The transistor including the oxide semiconductor layer which is purified in the above-described manner has a low off-state current and suppressed variation in electric characteristics and is electrically stable.

In addition, an increase in the contact resistance between an oxide semiconductor layer and source and drain electrodes can be suppressed in a transistor including the oxide semiconductor layer whose surface is terminated by plasma treatment using a gas including a halogen element; accordingly, the transistor can have a high on-state current and a high field effect mobility.

In the above-described manner, a manufacturing method of a semiconductor device having stable electric characteristics and a high field effect mobility can be provided.

The methods and structures described in this embodiment can be combined as appropriate with any of the methods and structures described in the other embodiments.

(Embodiment 2)

A semiconductor device (also referred to as a display device) having a display function can be manufactured using any of the transistors described as examples in Embodiment 1. Part or all of the driver circuits including the transistors can be formed over a substrate where a pixel portion is formed, whereby a system-on-panel can be obtained. In this embodiment, a semiconductor device having a display function including any of the transistors described as examples in Embodiment 1 will be described in detail with reference to FIGS. 6A to 6C, FIG. 7, FIG. 8, and FIG. 9.

Figure 6A:
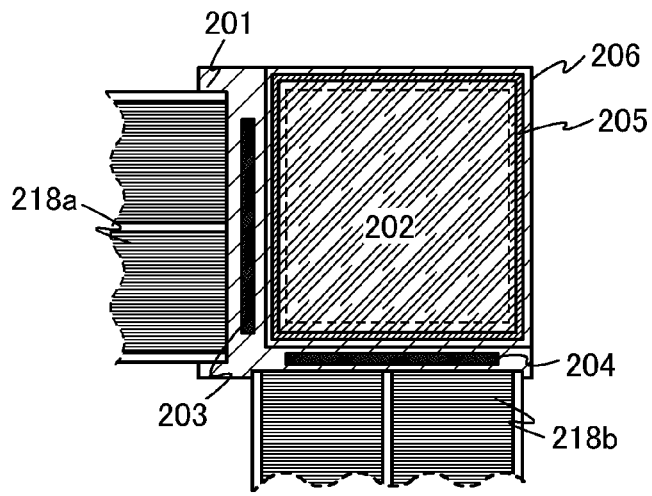
FIGS. 6A to 6C are plan views each illustrating an example of a semiconductor device which is an embodiment of the present invention.

In FIG. 6A, a sealant 205 is provided to surround a pixel portion 202 provided over a first substrate 201, and the pixel portion 202 is sealed with a second substrate 206. In FIG. 6A, a scan line driver circuit 204 and a signal line driver circuit 203 which are each formed using a single crystal semiconductor layer or a polycrystalline semiconductor layer over a substrate prepared separately, are mounted in a region different from the region surrounded by the sealant 205 over the first substrate 201. Various signals and potentials are supplied to the signal line driver circuit 203 and the scan line driver circuit 204, each of which is formed separately, and the pixel portion 202 from flexible printed circuits (FPCs) 218a and 218b.

Figure 6B:
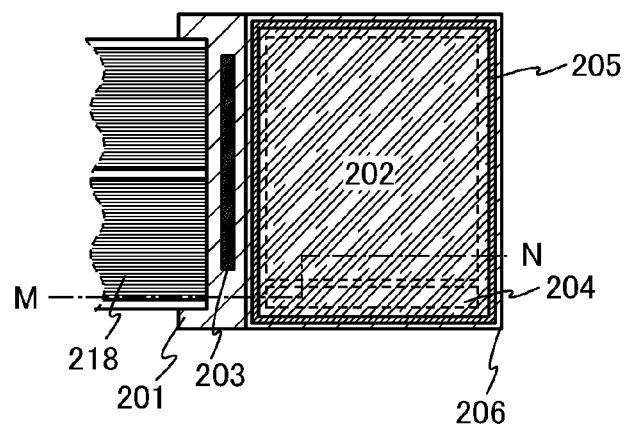
Figure 6C:
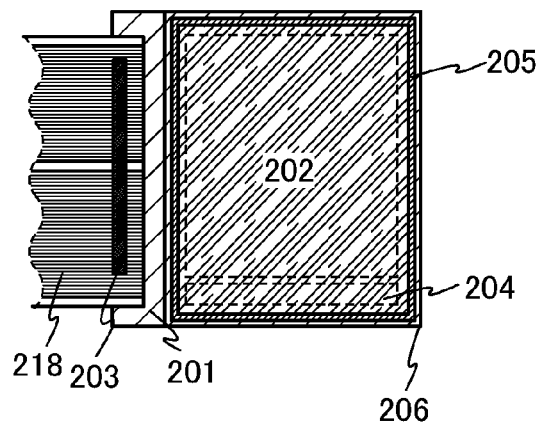

In FIGS. 6B and 6C, the sealant 205 is provided to surround the pixel portion 202 and the scan line driver circuit 204 which are provided over the first substrate 201. The second substrate 206 is provided over the pixel portion 202 and the scan line driver circuit 204. Thus, the pixel portion 202 and the scan line driver circuit 204 are sealed together with a display element, by the first substrate 201, the sealant 205, and the second substrate 206. In FIGS. 6B and 6C, the signal line driver circuit 203 which is formed using a single crystal semiconductor layer or a polycrystalline semiconductor layer over a substrate prepared separately is mounted in a region different from the region surrounded by the sealant 205 over the first substrate 201. In FIGS. 6B and 6C, various signals and potentials are supplied to the signal line driver circuit 203 which is separately formed, the scan line driver circuit 204, and the pixel portion 202, from an FPC 218.

Although FIGS. 6B and 6C each show the example in which the signal line driver circuit 203 is formed separately and mounted on the first substrate 201, the present invention is not limited to this structure. The scan line driver circuit may be separately formed and then mounted, or only part of the signal line driver circuit or part of the scan line driver circuit may be separately formed and then mounted.

Note that a method for connecting a separately formed driver circuit is not particularly limited, and a chip on glass (COG) method, a wire bonding method, a tape automated bonding (TAB) method, or the like can be used. FIG. 6A shows an example in which the signal line driver circuit 203 and the scan line driver circuit 204 are mounted by a COG method. FIG. 6B shows an example in which the signal line driver circuit 203 is mounted by a COG method. FIG. 6C shows an example in which the signal line driver circuit 203 is mounted by a TAB method.

The display device includes in its category a panel in which a display element is sealed, and a module in which an IC such as a controller is mounted on the panel.

Note that a display device in this specification means an image display device, a display device, or a light source (including a lighting device). The display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate 201 include a plurality of transistors and the transistor, the examples of which are described in Embodiment 1, can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or voltage, and specifically includes, in its category, an inorganic electroluminescent (EL) element, an organic EL element, and the like. Furthermore, a display medium whose contrast is changed by an electric effect, such as electronic ink, can be used.

Figure 7:
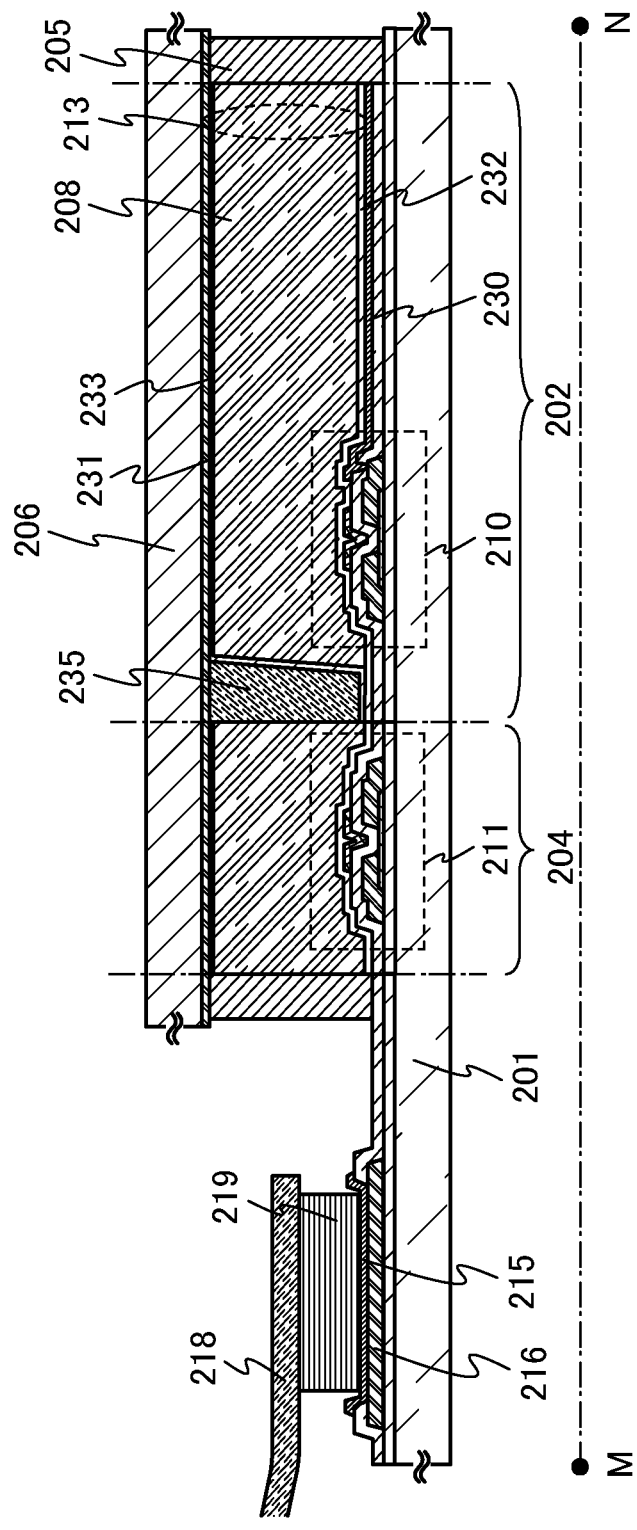
FIG. 7 is a cross-sectional view illustrating an example of a semiconductor device which is an embodiment of the present invention.
Figure 8:
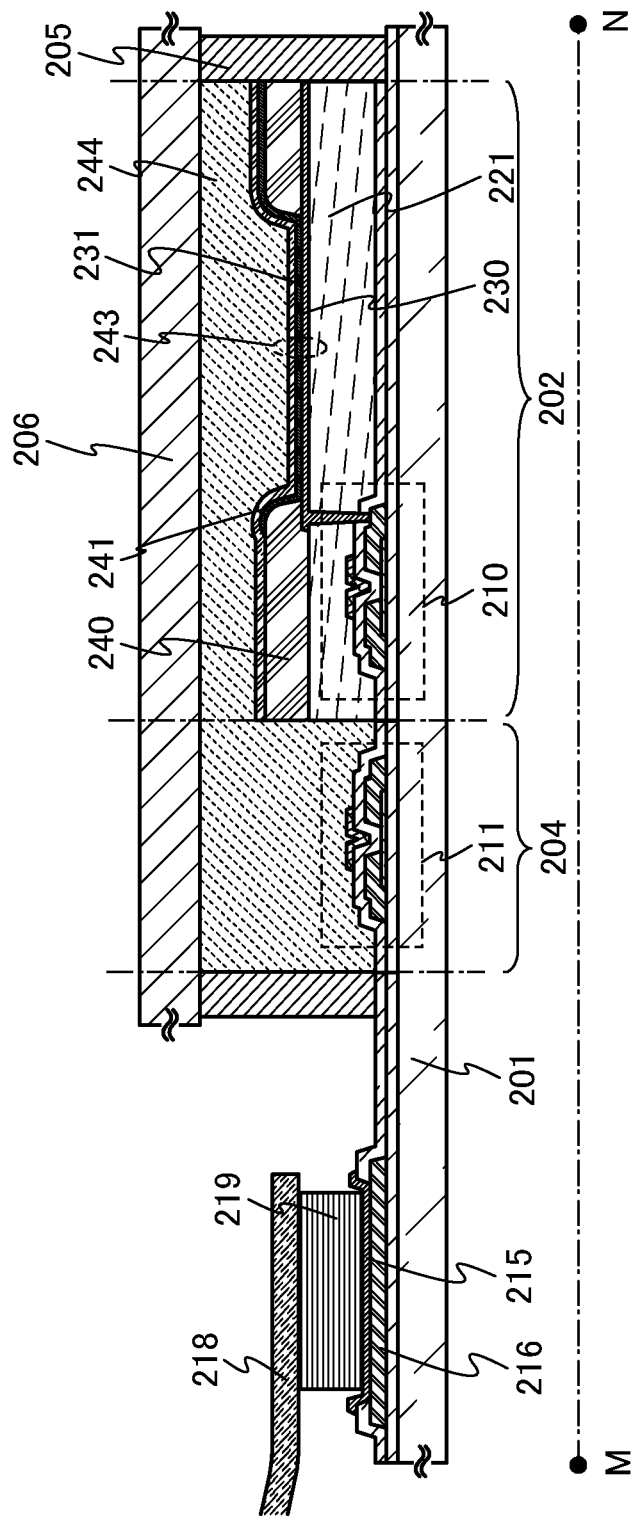
FIG. 8 is a cross-sectional view illustrating an example of a semiconductor device which is an embodiment of the present invention.
Figure 9:
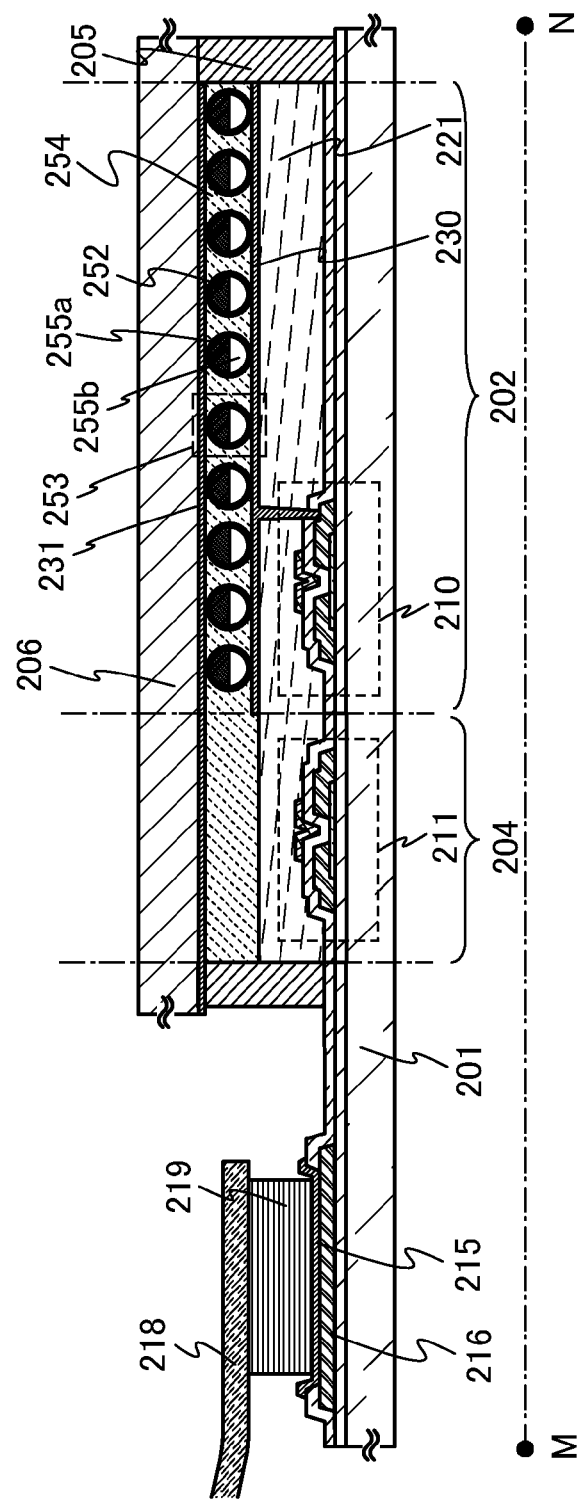
FIG. 9 is a cross-sectional view illustrating an example of a semiconductor device which is an embodiment of the present invention.

One embodiment of the semiconductor device will be described with reference to FIG. 7, FIG. 8, and FIG. 9. FIG. 7, FIG. 8, and FIG. 9 correspond to cross-sectional views taken along a broken line M-N in FIG. 6B.

As illustrated in FIG. 7, FIG. 8, and FIG. 9, the semiconductor device includes a connection terminal electrode 215 and a terminal electrode 216. The connection terminal electrode 215 and the terminal electrode 216 are electrically connected to a terminal included in the FPC 218 through an anisotropic conductive layer 219.

The connection terminal electrode 215 is formed of the same conductive layer as a first electrode layer 230. The terminal electrode 216 is formed of the same conductive layer as a source electrode and a drain electrode of transistors 210 and 211.

Each of the pixel portion 202 and the scan line driver circuit 204 provided over the first substrate 201 includes a plurality of transistors. In FIG. 7, FIG. 8, and FIG. 9, the transistor 210 included in the pixel portion 202 and the transistor 211 included in the scan line driver circuit 204 are illustrated as an example.

In this embodiment, any of the transistors described in Embodiment 1 can be applied to the transistors 210 and 211. The transistors 210 and 211 are transistors including an oxide semiconductor layer and having a high field effect mobility. Therefore, in this embodiment described with reference to FIG. 7, FIG. 8, and FIG. 9, a manufacturing method of a semiconductor device having a high field effect mobility can be provided.

The transistor 210 provided in the pixel portion 202 is electrically connected to the display element to form a display panel. A variety of display elements can be used as the display element as long as display can be performed.

An example of a liquid crystal display device using a liquid crystal element as a display element is illustrated in FIG. 7. In FIG. 7, a liquid crystal element 213 is a display element including the first electrode layer 230, a second electrode layer 231, and a liquid crystal layer 208. Note that an insulating layer 232 and an insulating layer 233 which serve as alignment layers are provided so that the liquid crystal layer 208 is sandwiched therebetween. The second electrode layer 231 is formed on the second substrate 206 side. The first electrode layer 230 and the second electrode layer 231 are stacked with the liquid crystal layer 208 sandwiched therebetween.

A spacer 235 is a columnar spacer obtained by selective etching of an insulating layer and is provided in order to control the thickness (a cell gap) of the liquid crystal layer 208. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment layer is unnecessary may be used. A blue phase is one of liquid crystal phases generated just before a cholesteric phase changes into an isotropic phase when the temperature of cholesteric liquid crystal is increased. Since the blue phase appears only in a narrow temperature range, a liquid crystal composition in which a chiral material is mixed at 5 wt. % or more is used for the liquid crystal layer in order to improve the temperature range. The liquid crystal composition which includes a liquid crystal exhibiting a blue phase and a chiral agent has a short response time of 1 msec or less and has optical isotropy, which makes the alignment process unneeded and the viewing angle dependence small. In addition, since an alignment layer does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1 \times 10^9$ $\Omega \cdot$cm or more, preferably $1 \times 10^{11}$ $\Omega \cdot$cm or more, further preferably $1 \times 10^{12}$ $\Omega \cdot$cm or more. Note that the specific resistivity in this specification is measured at 20° C.

The size of a storage capacitor provided in the liquid crystal display device is set considering the leakage current of the transistor provided in the pixel portion or the like so that charge can be held for a predetermined period. Since the transistor including a high-purity oxide semiconductor layer is used, a storage capacitor having a capacitance which is ⅓ or less, preferably ⅕ or less of a liquid crystal capacitance of each pixel is enough to be provided.

In the transistor used in this embodiment, which uses a purified oxide semiconductor layer, the current in the off state (the off-state current) can be made small. Therefore, an electrical signal such as an image signal can be held for a long period, and a writing interval can be set long when the power is on. Consequently, the frequency of refresh operation can be reduced, which leads to an effect of suppressing power consumption.

The transistor including a purified oxide semiconductor layer, an inside of which or at least a surface of which is terminated by a halogen element, used in this embodiment can have a high field effect mobility, whereby high-speed operation is possible. Thus, by using the transistor in a pixel portion of the liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is one of methods of controlling alignment of liquid crystal molecules of a liquid crystal display panel. The vertical alignment mode is a mode in which liquid crystal molecules are aligned vertically to a panel surface when voltage is not applied. Some examples are given as the vertical alignment mode. For example, a multi-domain vertical alignment (MVA) mode, a patterned vertical alignment (PVA) mode, an ASV mode, and the like can be given. Moreover, it is possible to use a method called domain multiplication or multi-domain design, in which a pixel is divided into some regions (subpixels) and molecules in the regions are aligned in different directions.

In the display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, with the use of a plurality of light-emitting diodes (LEDs) as a backlight, a time-division display method (a field-sequential driving method) can be employed. With the field-sequential driving method, color display can be performed without using a color filter.

As a display method in the pixel portion, a progressive method, an interlace method, or the like can be employed. Color elements controlled in a pixel at the time of color display are not limited to three colors: R, G, and B (R, G, and B correspond to red, green, and blue respectively). For example, R, G, B, and W (W corresponds to white), or R, G, B, and one or more of yellow, cyan, magenta, and the like can be used. The sizes of display regions may be different between respective dots of color elements. Note that the present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. The light-emitting element can have a top emission structure in which emitted light is extracted through the surface opposite to the substrate; a bottom emission structure in which emitted light is extracted through the surface on the substrate side; or a dual emission structure in which emitted light is extracted through the surface opposite to the substrate and the surface on the substrate side, and a light-emitting element having any of these emission structures can be used.

An example of a light-emitting device using a light-emitting element as a display element is illustrated in FIG. 8. A light-emitting element 243 which is a display element is electrically connected to the transistor 210 provided in the pixel portion 202. The structure of the light-emitting element 243 is not limited to the stacked structure including the first electrode layer 230, an electroluminescent layer 241, and the second electrode layer 231, which is illustrated in FIG. 8. The structure of the light-emitting element 243 can be changed as appropriate depending on the direction in which light is extracted from the light-emitting element 243, or the like.

A partition wall 240 is formed using an organic insulating material or an inorganic insulating material. It is particularly preferable that the partition wall 240 be formed using a photosensitive resin material to have an opening over the first electrode layer 230 so that a sidewall of the opening is formed as a tilted surface with continuous curvature.

The electroluminescent layer 241 may be formed with either a single layer or a plurality of stacked layers.

A protective layer may be formed over the second electrode layer 231 and the partition wall 240 in order to prevent entry of oxygen, hydrogen, moisture, carbon dioxide, or the like into the light-emitting element 243. As the protective layer, a silicon nitride layer, a silicon nitride oxide layer, a DLC layer, or the like can be formed. In a space sealed with the first substrate 201, the second substrate 206, and the sealant 205, a filler 244 is provided and tightly sealed. It is preferable that the light-emitting element be packaged (sealed) with a protective film (such as a laminate film or an ultraviolet curable resin film) or a cover material with high air-tightness and little degasification so that the light-emitting element is not exposed to the outside air, in this manner.

As the filler 244, an ultraviolet curable resin or a thermosetting resin can be used other than an inert gas such as nitrogen or argon, and polyvinyl chloride (PVC), acrylic, polyimide, an epoxy resin, a silicone resin, polyvinyl butyral (PVB), ethylene vinyl acetate (EVA), or the like can be used. For example, nitrogen may be used as the filler.

If needed, an optical film, such as a polarizing plate, a circularly polarizing plate (including an elliptically polarizing plate), a retardation plate (a quarter-wave plate or a half-wave plate), or a color filter, may be provided as appropriate on a surface on the light emission side of the light-emitting element. Further, the polarizing plate or the circularly polarizing plate may be provided with an anti-reflection layer. For example, anti-glare treatment by which reflected light can be diffused by projections and depressions on the surface so as to reduce the glare can be performed.

An electronic paper in which electronic ink is driven can be provided as the display device. The electronic paper is also called an electrophoretic display device (electrophoretic display) and has advantages in that it has the same level of readability as regular paper, it consumes less power than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display method can be used. The twisting ball display method refers to a method in which spherical particles each colored in white and black are arranged between a first electrode layer and a second electrode layer which are electrode layers used for a display element, and a potential difference is generated between the first electrode layer and the second electrode layer to control orientation of the spherical particles, so that display is performed.

FIG. 9 shows an active matrix electronic paper which is one embodiment of a semiconductor device. The electronic paper in FIG. 9 is an example of a display device using a twisting ball display method.

Between the first electrode layer 230 connected to the transistor 210 and the second electrode layer 231 provided on the second substrate 206, spherical particles 253 each of which includes a black region 255*a*, a white region 255*b*, and a cavity 252 around the regions which is filled with liquid, are provided. A space around the spherical particles 253 is filled with a filler 254 such as a resin. The second electrode layer 231 corresponds to a common electrode (counter electrode). The second electrode layer 231 is electrically connected to a common potential line.

Note that in FIG. 7, FIG. 8, and FIG. 9, a flexible substrate as well as a glass substrate can be used as the first substrate 201 and the second substrate 206. For example, a plastic substrate having light-transmitting properties can be used. For plastic, a fiberglass-reinforced plastics (FRP) plate, a polyvinyl fluoride (PVF) film, a polyester film, or an acrylic resin film can be used. A sheet with a structure in which an aluminum foil is sandwiched between PVF films or polyester films can also be used.

An insulating layer 221 can be formed using an organic insulating material or an inorganic insulating material. Note that an organic insulating material having heat resistance, such as an acrylic resin, polyimide, a benzocyclobutene-based resin, polyamide, or an epoxy resin is preferably used as a planarizing insulating layer. Other than such organic insulating materials, it is possible to use a low-dielectric constant material (a low-k material), a siloxane-based resin, phosphosilicate glass (PSG), borophosphosilicate glass (BPSG), or the like. The insulating layer 221 may be formed by stacking a plurality of insulating layers formed of these materials.

There is no particular limitation on the method for forming the insulating layer 221, and the insulating layer 221 can be formed, depending on a material thereof, by a sputtering method, a spin coating method, a dipping method, a spray coating method, a droplet discharge method (e.g., an ink jet method, screen printing, or offset printing), a roll coating method, a curtain coating method, a knife coating method, or the like.

The display device performs display by transmitting light from a light source or a display element. Thus, the substrates and the thin films such as insulating layers and conductive layers provided in the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, depending on the direction in which light is extracted, the position where the electrode layer is provided, and the pattern structure of the electrode layer.

A light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added, can be used for the first electrode layer 230 and the second electrode layer 231.

The first electrode layer 230 and the second electrode layer 231 can be formed using one kind or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as a conductive polymer) can be used for the first electrode layer 230 and the second electrode layer 231. As the conductive high molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken due to static electricity or the like, a protective circuit for protecting the driver circuit is preferably provided. The protective circuit is preferably formed using a nonlinear element.

As described above, by using any of the transistors described as examples in Embodiment 1, a semiconductor device capable of high speed operation can be manufactured. Note that the transistors described as examples in Embodiment 1 can be applied to not only semiconductor devices having display functions described above but also semiconductor devices having a variety of functions, such as a power device which is mounted on a power supply circuit, a semiconductor integrated circuit such as an LSI, and a semiconductor device having an image sensor function of reading information of an object.

The methods and structures described in this embodiment can be combined as appropriate with any of the methods and structures described in the other embodiments.

(Embodiment 3)

A semiconductor device to which a manufacturing method of a semiconductor device according to one embodiment of the present invention is applied can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances each including the semiconductor device described in the above embodiment will be described.

Figure 10A:
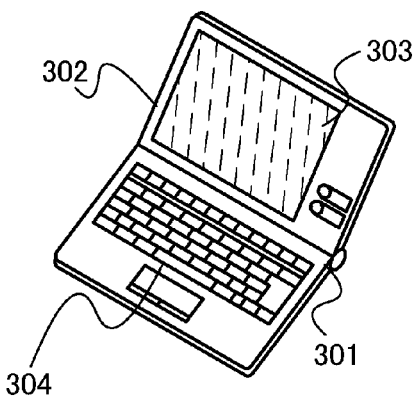
FIGS. 10A to 10F illustrate modes of a semiconductor device which is an embodiment of the present invention.

FIG. 10A illustrates a laptop personal computer, which includes a main body 301, a housing 302, a display portion 303, a keyboard 304, and the like. By applying the manufacturing method of a semiconductor device described in Embodiment 1, a laptop personal computer including a transistor capable of high speed operation can be provided.

Figure 10B:
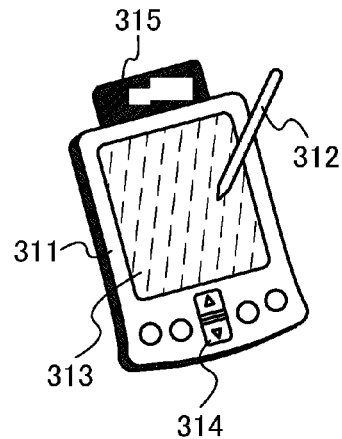

FIG. 10B illustrates a portable information terminal (PDA) which includes a display portion 313, an external interface 315, an operation button 314, and the like in a main body 311. A stylus 312 is included as an accessory for operation. By applying the manufacturing method of a semiconductor device described in Embodiment 1, a portable information terminal (PDA) including a transistor capable of high speed operation can be provided.

Figure 10C:
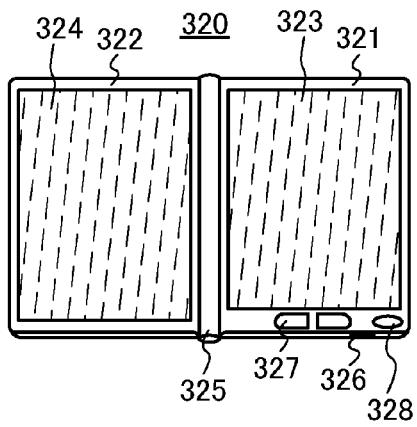

FIG. 10C illustrates an example of an e-book reader. For example, an e-book reader 320 includes two housings, a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 and a display portion 324 are incorporated in the housing 321 and the housing 322, respectively. The display portion 323 and the display portion 324 may display one image or different images. When the display portion 323 and the display portion 324 display different images, for example, text can be displayed on a display portion on the right side (the display portion 323 in FIG. 10C) and graphics can be displayed on a display portion on the left side (the display portion 324 in FIG. 10C). By applying the manufacturing method of a semiconductor device described in Embodiment 1, an e-book reader including a transistor capable of high speed operation can be provided.

FIG. 10C illustrates an example in which the housing 321 is provided with an operation portion and the like. For example, the housing 321 is provided with a power switch 326, an operation key 327, a speaker 328, and the like. With the operation key 327, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 320 may have a function of an electronic dictionary.

The e-book reader 320 may have a configuration capable of wirelessly transmitting and receiving data. Through wireless communication, desired book data or the like can be purchased and downloaded from an e-book server.

Figure 10D:
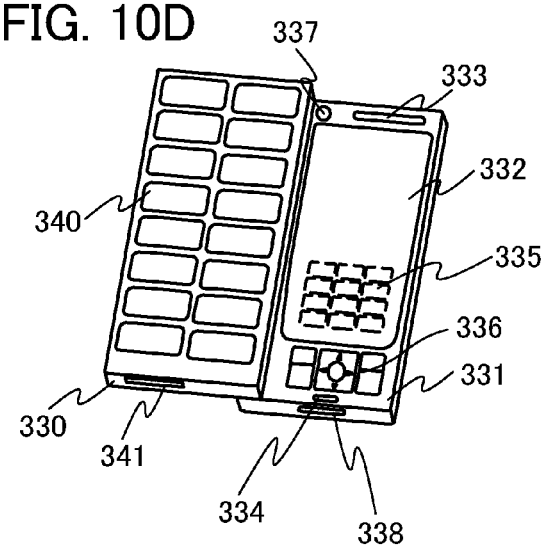

FIG. 10D illustrates a mobile phone, which includes two housings, a housing 330 and a housing 331. The housing 331 includes a display panel 332, a speaker 333, a microphone 334, a pointing device 336, a camera lens 337, an external connection terminal 338, and the like. In addition, the housing 330 includes a solar cell 340 having a function of charge of the mobile phone, an external memory slot 341, and the like. Further, an antenna is incorporated in the housing 331. By applying the manufacturing method of a semiconductor device described in Embodiment 1, a mobile phone including a transistor capable of high speed operation can be provided.

Further, the display panel 332 is provided with a touch panel. A plurality of operation keys 335 which are displayed as images is illustrated by dashed lines in FIG. 10D. Note that a boosting circuit by which a voltage output from the solar cell 340 is increased to be sufficiently high for respective circuits is also included.

In the display panel 332, the display orientation can be changed as appropriate depending on a usage pattern. Further, the mobile phone is provided with the camera lens 337 on the same surface as the display panel 332, and thus it can be used as a video phone. The speaker 333 and the microphone 334 can be used for videophone calls, recording and playing sound, and the like as well as voice calls. Moreover, the housings 330 and 331 in a state where they are opened as illustrated in FIG. 10D can be slid so that one overlaps the other; therefore, the size of the mobile phone can be reduced, which makes the mobile phone suitable for being carried.

The external connection terminal 338 can be connected to an AC adapter and various types of cables such as a USB cable, and charging and data communication with a personal computer are possible. Moreover, a larger amount of data can be saved and moved by inserting a recording medium to the external memory slot 341.

Further, in addition to the above functions, an infrared communication function, a television reception function, or the like may be provided.

Figure 10E:
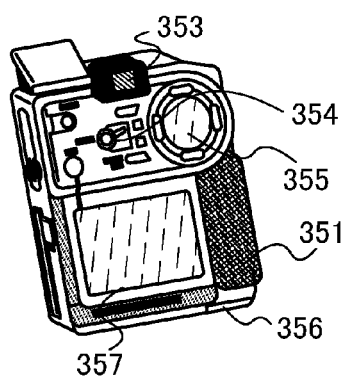

FIG. 10E illustrates a digital video camera which includes a main body 351, a display portion (A) 357, an eyepiece 353, an operation switch 354, a display portion (B) 355, a battery 356, and the like. By applying the manufacturing method of a semiconductor device described in Embodiment 1, a digital video camera capable of high speed operation can be provided.

Figure 10F:
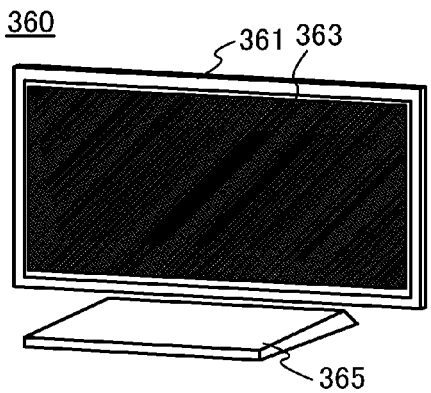

FIG. 10F illustrates an example of a television set. In a television set 360, a display portion 363 is incorporated in a housing 361. The display portion 363 can display images. Here, the housing 361 is supported by a stand 365. By applying the manufacturing method of a semiconductor device described in Embodiment 1, the television set 360 is capable of high speed operation.

The television set 360 can be operated by an operation switch of the housing 361 or a separate remote controller. Further, the remote controller may be provided with a display portion for displaying data output from the remote controller.

Note that the television set 360 is provided with a receiver, a modem, and the like. With the use of the receiver, general television broadcasting can be received. Furthermore, when the television set is connected to a communication network with or without wires via the modem, one-way (from a sender to a receiver) or two-way (between a sender and a receiver or between receivers) information communication can be performed.

The structures, the methods, and the like described in this embodiment can be combined as appropriate with any of the structures, the methods, and the like described in the other embodiments.

EXAMPLE 1

In this example, a manufacturing method of a semiconductor device, which is an embodiment of the present invention, and measurement results of electric characteristics of a transistor obtained by the manufacturing method of a semiconductor device of an embodiment of the present invention will be described.

Figure 11:
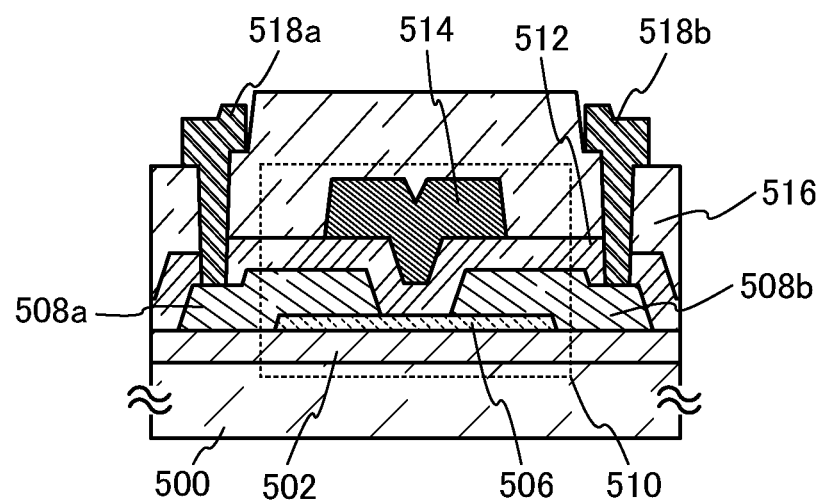
FIG. 11 illustrates a semiconductor device manufactured using an embodiment of the present invention.

The structure of the transistor in this example is illustrated in FIG. 11. The manufacturing method will be described below with reference to FIG. 11.

In a transistor 510 illustrated in FIG. 11, an insulating layer 502 is formed over a substrate 500. As the substrate 500, a glass substrate with a thickness of 0.7 mm was used, and as the insulating layer 502, a silicon oxide layer with a thickness of 300 nm was formed with a sputtering apparatus.

Next, an oxide semiconductor layer 506 is formed over the insulating layer 502. The oxide semiconductor layer 506 was formed with a sputtering apparatus under the following conditions: the flow rate of Ar was 30 sccm, the flow rate of $O_2$ was 15 sccm, the electric power was 0.5 kW (DC), the pressure was 0.4 Pa, the T-S distance was 60 mm, the substrate temperature was 200° C., and the thickness was 30 nm. As a sputtering target, a metal oxide target having the following composition ratio was used: $In_2O_3:Ga_2O_3:ZnO=1:1:2$ [molar ratio].

After the oxide semiconductor layer 506 was formed, heat treatment was performed at 450° C. in a nitrogen atmosphere for an hour using a baking furnace.

Then, plasma treatment using a gas including a halogen element is performed on the oxide semiconductor layer 506. The plasma treatment using a gas including a halogen element was performed with a dry etching apparatus under the following conditions: the flow rate of $NF_3$ was 20 sccm, the flow rate of $N_2$ was 80 sccm, the electric power was 2 kW (RF), the pressure was 0.67 Pa, the substrate temperature was 40° C., and the treatment time was 10 seconds.

Next, a source electrode 508a and a drain electrode 508b were formed using a tungsten layer having a thickness of 100 nm.

Then, a gate insulating layer 512 is formed over the oxide semiconductor layer 506, the source electrode 508a, and the drain electrode 508b. As the gate insulating layer 512, a silicon oxynitride layer with a thickness of 15 nm was formed with a plasma CVD apparatus. Note that the dielectric constant ($\in$) of the silicon oxynitride layer is 4.1.

Next, a gate electrode 514 is formed over the gate insulating layer 512. The gate electrode 514 was formed with a sputtering apparatus by forming a tantalum nitride layer with a thickness of 20 nm and then successively forming a tungsten layer with a thickness of 180 nm over the tantalum nitride layer under vacuum.

Then, a protective insulating layer 516 is formed over the gate insulating layer 512 and the gate electrode 514. As the protective insulating layer 516, a silicon oxide layer with a thickness of 300 nm was formed with a sputtering apparatus.

Then, a mask having a desired shape is formed over the protective insulating layer 516 by photolithography, and openings reaching the source electrode 508a and the drain electrode 508b are formed with a dry etching apparatus.

Next, a source wiring 518a and a drain wiring 518b which are connected to the source electrode 508a and the drain electrode 508b through the openings formed in the protective insulating layer 516 and the gate insulating layer 512 are formed. The source wiring 518a and the drain wiring 518b were formed with a sputtering apparatus by forming a titanium layer with a thickness of 50 nm, forming an aluminum layer with a thickness of 100 nm over the titanium layer, and forming a titanium layer with a thickness of 5 nm over the aluminum layer. Note that the source wiring 518a and the drain wiring 518b have a three-layer structure of the titanium layer, the aluminum layer, and the titanium layer, and the three layers are formed successively under vacuum.

Through the above-described process, the transistor 510 is formed. In the formation of the transistor 510, the plasma treatment using a gas including a halogen element is performed after formation of the oxide semiconductor layer 506, which suppresses an increase in the contact resistance between the oxide semiconductor layer 506 and the source and drain electrodes 508a and 508b.

Figure 12:
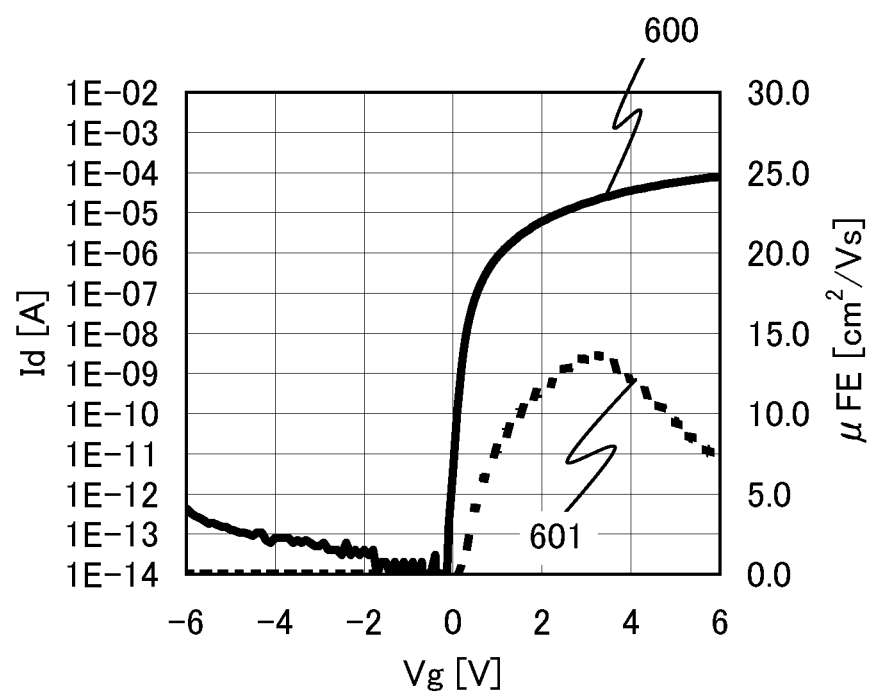
FIG. 12 is a graph of a semiconductor device manufactured using an embodiment of the present invention.

On the transistor 510 manufactured in this example, the drain current (Id)-gate voltage (Vg) measurement was conducted. The measurement results are shown in FIG. 12. The channel length L of the measured transistor was 10 μm, and the channel width W was 20 μm. The voltage (Vd) between the source electrode and the drain electrode of the transistor was set to 3 V.

A solid line 600 in FIG. 12 shows the drain current (Id) when the voltage (Vd) between the source electrode and the drain electrode is 3 V and the gate voltage (Vg) is changed from −6 V to 6 V at 0.1 V interval. In addition, a broken line 601 shows the field effect mobility (μFE) when the voltage (Vd) between the source electrode and the drain electrode is 3 V and the gate voltage (Vg) is changed from −6 V to 6 V at 0.1 V interval.

According to FIG. 12, the maximum field effect mobility (μFE) of the transistor of this example in a saturation region is 13.6 $cm^2/Vs$ in the case where the voltage (Vd) between the source electrode and the drain electrode is 3 V and the gate voltage (Vg) is changed from −6 V to 6 V.

COMPARATIVE EXAMPLE

Figure 13:
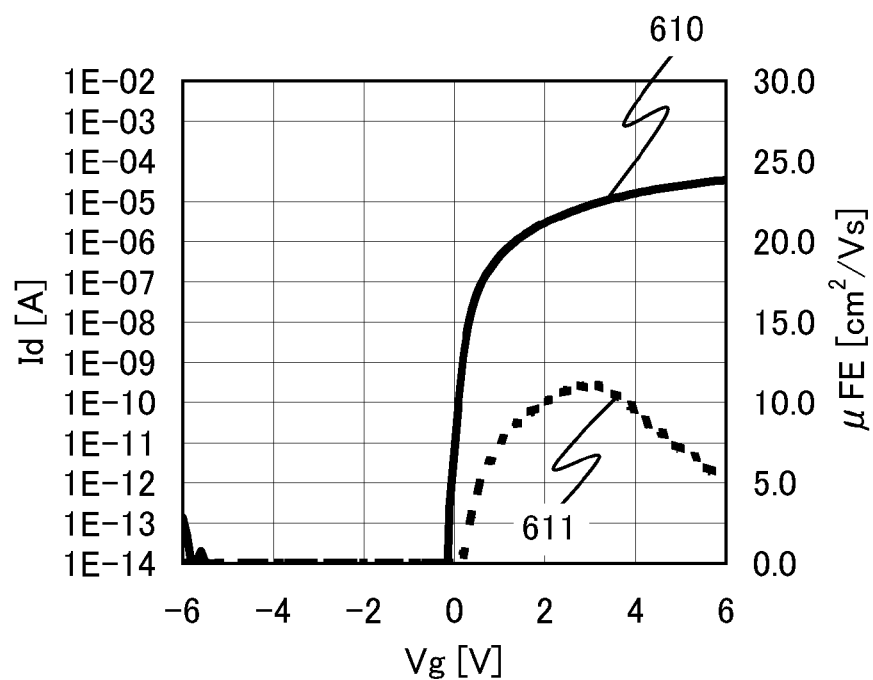
FIG. 13 is a graph of a semiconductor device manufactured for comparison with an embodiment of the present invention.

Next, for comparison with the transistor of this example, a comparative transistor in which the plasma treatment using a gas including a halogen element was not performed after the formation of the oxide semiconductor layer 506 was manufactured. Then, the drain current (Id)-gate voltage (Vg) measurement of the comparative transistor was also conducted in a manner similar to that of the transistor 510. The measurement results are shown in FIG. 13. The channel length L of the measured comparative transistor was 10 μm, and the channel width W was 50 μm; the channel width W was different from that of the transistor 510. The comparative transistor is the same as the transistor 510 illustrated in FIG. 11 in the structure and is different only in the point that the plasma treatment using a gas including a halogen element is not performed after the formation of the oxide semiconductor layer 506.

A solid line 610 in FIG. 13 shows the drain current (Id) when the voltage (Vd) between the source electrode and the drain electrode is 3 V and the gate voltage (Vg) is changed from −6 V to 6 V at 0.1 V interval. In addition, a broken line 611 shows the field effect mobility (μFE) when the voltage (Vd) between the source electrode and the drain electrode is 3 V and the gate voltage (Vg) is changed from −6 V to 6 V at 0.1 V interval.

According to FIG. 13, the maximum field effect mobility (μFE) of the comparative transistor in a saturation region is 10.3 cm$^2$/Vs in the case where the voltage (Vd) between the source electrode and the drain electrode is 3 V and the gate voltage (Vg) is changed from −6 V to 6 V.

From the above, it is found that the transistor 510 of this example has a higher field effect mobility than the comparative transistor on which the plasma treatment using a gas including a halogen element is not performed.

This application is based on Japanese Patent Application serial no. 2010-151641 filed with Japan Patent Office on Jul. 2, 2010, the entire contents of which are hereby incorporated by reference.

What is claimed is:

1. A manufacturing method of a semiconductor device, comprising the steps of:
    forming an oxide semiconductor layer over a substrate;
    forming a gate insulating layer over the oxide semiconductor layer;
    forming a gate electrode over the gate insulating layer;
    forming a source region and a drain region in regions of the oxide semiconductor layer by using the gate electrode as a mask;
    forming a protective insulating layer over the oxide semiconductor layer and the gate electrode;
    forming openings in regions overlapping with the source region and the drain region of the protective insulating layer; and
    performing plasma treatment using a gas including a halogen element on the source region and the drain region of the oxide semiconductor layer.

2. The manufacturing method of a semiconductor device according to claim 1, wherein the oxide semiconductor layer has a carrier concentration of lower than $1 \times 10^{-14}$ cm$^{-3}$.

3. The manufacturing method of a semiconductor device according to claim 1, wherein the gas including a halogen element used in the plasma treatment includes any one element of F, Cl, Br, and I.

4. The manufacturing method of a semiconductor device according to claim 1, wherein the gas including a halogen element used in the plasma treatment is NF$_3$.

5. A manufacturing method of a semiconductor device, comprising the steps of:
    forming an oxide semiconductor layer over a substrate; and
    performing plasma treatment using a gas including a halogen element on the oxide semiconductor layer.

6. The manufacturing method of a semiconductor device according to claim 5, wherein the oxide semiconductor layer has a carrier concentration of lower than $1 \times 10^{-14}$ cm$^{-3}$.

7. The manufacturing method of a semiconductor device according to claim 5, wherein the gas including a halogen element used in the plasma treatment includes any one element of F, Cl, Br, and I.

8. The manufacturing method of a semiconductor device according to claim 5, wherein the gas including a halogen element used in the plasma treatment is NF$_3$.

* * * * *